United States Patent
Zhang

(10) Patent No.: US 11,108,494 B2
(45) Date of Patent: Aug. 31, 2021

(54) ENCODING INFORMATION BITS USING PILAR CODE GENERATED MATRICES

(71) Applicant: SHANGHAI LANGBO COMMUNICATION TECHNOLOGY COMPANY LIMITED, Shanghai (CN)

(72) Inventor: XiaoBo Zhang, Shanghai (CN)

(73) Assignee: SHANGHAI LANGBO COMMUNICATION TECHNOLOGY COMPANY LIMITED, Shanghai (CN)

(*) Notice: Subject to any disclaimer, the term of this patent is extended or adjusted under 35 U.S.C. 154(b) by 0 days.

(21) Appl. No.: 16/533,815

(22) Filed: Aug. 7, 2019

(65) Prior Publication Data

US 2019/0363823 A1 Nov. 28, 2019

Related U.S. Application Data

(63) Continuation of application No. PCT/CN2017/073160, filed on Feb. 9, 2017.

(51) Int. Cl.
*H04L 1/00* (2006.01)
*H04L 5/00* (2006.01)

(52) U.S. Cl.
CPC .......... *H04L 1/0009* (2013.01); *H04L 1/0071* (2013.01); *H04L 5/006* (2013.01)

(58) Field of Classification Search
CPC ..... H04L 1/0009; H04L 1/0071; H04L 5/006; H04L 1/0041; H04L 1/0045;
(Continued)

(56) References Cited

U.S. PATENT DOCUMENTS

| 10,020,913 B2* | 7/2018 | Shen ..................... H04L 1/0043 |
| 2011/0138257 A1* | 6/2011 | Zivic ..................... H03M 13/27 |
| | | 714/777 |

(Continued)

FOREIGN PATENT DOCUMENTS

| CN | 102164025 | 8/2011 |
| CN | 102694625 A | 9/2012 |

(Continued)

OTHER PUBLICATIONS

ISR received in application No. PCT/CN2017/073160 dated May 12, 2017.

(Continued)

*Primary Examiner* — Ian N Moore
*Assistant Examiner* — Rushil Parimal Sampat
(74) *Attorney, Agent, or Firm* — Maschoff Brennan

(57) ABSTRACT

A method and a device for channel coding in a terminal and a base station are disclosed. The base station performs channel coding and transmits a first radio signal in sequence. A first bit block is for an input to the channel coding based on a polar code. An output after the channel coding is for generating the first radio signal. The first bit block comprises bit(s) in a first and a second bit sub-block. A value of the first bit sub-block or the first bit sub-block is related to a number of bits in the second bit sub-block or in the first bit block. Position(s) of bit(s) in the first bit sub-block in the first bit block is(are) determined by default. An advantage of the present disclosure is to lift the burden on blind detections of the UE and support a more flexible information transmission format.

16 Claims, 11 Drawing Sheets

(58) Field of Classification Search
CPC ... H04L 1/0057; H04L 1/0061; H04L 1/0072; H04L 1/00; H03M 13/13
See application file for complete search history.

(56) References Cited

U.S. PATENT DOCUMENTS

2017/0047947 A1* 2/2017 Hong ................ H03M 13/2906
2018/0198467 A1* 7/2018 Nammi ................ H04L 1/0002

FOREIGN PATENT DOCUMENTS

| | | |
|---|---|---|
| CN | 104079370 A | 10/2014 |
| WO | 2015066925 A1 | 5/2015 |
| WO | 2016141544 A1 | 9/2016 |

OTHER PUBLICATIONS

Non-final rejection Response cited "Channel polarization: A method for constructing capacity-achieving codes for symmetric binary-input memoryless channel".
CN201780068873.8 1st Office Action dated Apr. 26, 2021.
CN201780068873.8 First Search Report dated Apr. 20, 2021.
AT amp etc R1-1700324"Design of Polar Codes for Control Channel in NR" Jan. 9, 2017.

* cited by examiner

ENCODING INFORMATION BITS USING PILAR CODE GENERATED MATRICES

CROSS-REFERENCE TO RELATED APPLICATION

This application is a continuation of International Application No. PCT/CN2017/073160, filed Feb. 9, 2017, the full disclosure of which is incorporated herein by reference.

TECHNICAL FIELD

The present disclosure relates to a scheme for transmitting radio signals in wireless communication systems, and in particular to a transmission method and device used for channel coding.

BACKGROUND

Polar Codes are a coding scheme first proposed by Professor Erdal Arikan from University of Birken in Turkey in 2008, which may realize the code construction method of the capacity of a symmetrical Binary input Distributed Memoryless Channel (B-DMC). At the 3rd Generation Partner Project (3GPP) RAN1 #87 conference, the 3GPP determined the use of a Polar code scheme as a control channel coding scheme of the 5G Enhanced Mobile Broadband (eMBB) scenario.

In the traditional Long Term Evolution (LTE) system, different Downlink Control Information (DCI) formats correspond to different numbers of coded bits. User Equipment (UE) performs blind detection on the Physical Downlink Control Channel (PDCCH) carrying the DCI according to all possible DCI formats corresponding to the current transmission mode. The method of receiving the PDCCH causes the number of blind detections at the UE side to increase as the candidate item of the number of bits corresponding to the DCI increases.

SUMMARY

The inventors have discovered through researches that since different sub-channels of polar codes correspond to different channel capacities, information bits mapped to each sub-channel may experience varied Bit Error Rate (BER), and different BERs can be acquired after different numbers of frozen bits are assumed at the UE side, therefore, features of polar codes can be applied in a base station which performs channel coding pre-processing and unified channel coding on different DCI formats in sequence, and in a UE which performs unified channel pre-decoding and channel decoding in sequence on received bits, hence a decrease in the number of blind detections at the UE side.

In view of the above problem, the present disclosure provides a solution. It should be noted that embodiments in the present disclosure and characteristics in the embodiments may be arbitrarily combined if no conflict is incurred. For example, embodiments of a first node and characteristics of the embodiments in the present disclosure may be applied to a second node in the present disclosure, and vice versa.

The present disclosure discloses a method in a base station for wireless communication, comprising:
  performing channel coding; and
  transmitting a first radio signal;
  wherein a first bit block is used for an input to the channel coding. The channel coding is based on a polar code. An output after the channel coding is used for generating the first radio signal. The first bit block comprises bit(s) in a first bit sub-block and bit(s) in a second bit sub-block. A value of the first bit sub-block is related to a number of bits in the second bit sub-block; or, a value of the first bit sub-block is related to a number of bits in the first bit block. A position(s) of the bit(s) in the first bit sub-block in the first bit block is(are) determined by default. The first bit sub-block and the second bit sub-block respectively comprise a positive integer number of bit(s). The number of bits in the second bit sub-block is a candidate value of K candidate values. The candidate value is a positive integer, the K is a positive integer greater than 1.

In one embodiment, an advantage of the above method is that information bit blocks of different lengths use a same channel coding, thus reducing the number of blind detections at the UE side.

In one embodiment, the first radio signal is a multicarrier symbol.

In one embodiment, the first radio signal is an Orthogonal Frequency Division Multiplexing (OFDM) symbol.

In one embodiment, the first radio signal is a Discrete Fourier Transform Spread OFDM (DFT-S-OFDM) symbol.

In one embodiment, an output after the channel coding is subjected to modulation to generate the first radio signal.

In one embodiment, an output after the channel coding is subjected to precoding to generate the first radio signal.

In one embodiment, the first bit block is an input to the channel coding.

In one embodiment, each segment of the first bit block after segmentation is an input to the channel coding.

In one embodiment, the first bit block corresponds to part of bits in an input to the channel coding.

In one embodiment, the first bit block only comprises all information bits in an input to the channel coding.

In one embodiment, the first bit block only comprises part of information bits and check bits corresponding to the part of information bits in an input to the channel coding.

In one embodiment, the first bit block corresponds to all bits in an input to the channel coding.

In one embodiment, a value of the first bit sub-block explicitly indicates a number of bits in the second bit sub-block.

In one embodiment, a value of the first bit sub-block implicitly indicates a number of bits in the second bit sub-block.

In one embodiment, an index of the candidate value in the K candidate values is used for determining a value of the first bit sub-block.

In one embodiment, a value of the first bit sub-block explicitly indicates a number of bits in the first bit block.

In one embodiment, a value of the first bit sub-block implicitly indicates a number of bits in the first bit block.

In one embodiment, the phrase "determined by default" means that there is no need for configuration by a downlink signaling.

In one embodiment, the phrase "determined by default" means that there is no need for explicit configuration by a downlink signaling.

In one embodiment, the phrase "determined by default" means "fixed".

In one embodiment, the phrase "determined by default" means: for the first bit sub-block with a given number of bits, a position of the first bit sub-block in the first bit block is fixed.

In one embodiment, the phrase "determined by default" means: for the first bit block with a given number of bits, a position of the first bit sub-block in the first bit block is fixed.

In one embodiment, the phrase "determined by default" means: for the first bit block occupying a given time-frequency resource, a position of the first bit sub-block in the first bit block is fixed.

In one embodiment, the phrase that the position(s) of bit(s) in the first bit sub-block in the first bit block refers to: an initial position(s) of bit(s) in the first bit sub-block in the first bit block.

In one embodiment, the phrase that the position(s) of bit(s) in the first bit sub-block in the first bit block refers to: an end position(s) of bit(s) in the first bit sub-block in the first bit block.

In one embodiment, the phrase that the position(s) of bit(s) in the first bit sub-block in the first bit block refers to: a restricted range of bit(s) in the first bit sub-block in the first bit block.

In one embodiment, positions of bits in the first bit sub-block in the first bit block are non-consecutive.

In one embodiment, positions of bits in the first bit sub-block in the first bit block are consecutive.

In one embodiment, positions of bits in the second bit sub-block in the first bit block are non-consecutive.

In one embodiment, positions of bits in the second bit sub-block in the first bit block are consecutive.

In one embodiment, the first bit sub-block is in the forefront of the first bit block. A first bit and a second bit are any two bits in the first bit block, the first bit is before the second bit, a channel capacity of a sub-channel mapped by the first bit is greater than a channel capacity of a sub-channel mapped by the second bit.

In one embodiment, a number of bit(s) in the first bit sub-block is a constant.

In one embodiment, a number of bit(s) in the first bit sub-block is configurable.

In one embodiment, the K candidate values respectively correspond to K DCI formats.

In one sub-embodiment of the above embodiment, the second bit sub-block comprises at least one of CIF field, a resource allocation field, a Modulation and Coding Status (MCS) field, an NDI field, a HARQ process number field, a TPC field, a field of parameters for indicating DMRS, or a CRC bit.

Specifically, according to one aspect of the present disclosure, further comprising:
transmitting first information.
Herein, the first information is used for determining the number of bit(s) in the first bit sub-block and the K candidate values.

Specifically, according to one aspect of the present disclosure, further comprising:
transmitting first information.
Herein, the first information is used for determining the number of bit(s) in the first bit sub-block.

Specifically, according to one aspect of the present disclosure, further comprising:
transmitting first information.
the first information is used for determining the K candidate values.

In one embodiment, an advantage of the above method is that more flexible configuration of information bit transmission is supported so as to enhance transmission efficiency and reliability.

In one embodiment, the first information is semi-statically configured.

In one embodiment, the first information is UE-specific.

In one embodiment, the first information comprises one or more Radio Resource Control (RRC) Information Elements (IEs).

In one sub-embodiment of the above embodiment, part of RRC IEs in the multiple RRC IEs are cell-common, and the other part of RRC IEs in the multiple RRC IEs are UE-specific.

In one embodiment, the first information explicitly indicates at least one of a number of bit(s) in the first bit sub-block or the K candidate values.

In one embodiment, the first information implicitly indicates at least one of a number of bit(s) in the first bit sub-block or the K candidate values.

In one embodiment, the first information indicates a current transmission configuration of the UE, the transmission configuration implicitly indicates at least one of a number of bit(s) in the first bit sub-block or the K candidate values.

In one embodiment, the transmission configuration comprises parameters relevant to multi-antennas.

In one embodiment, the transmission configuration comprises parameters relevant to carrier aggregation.

Specifically, according to one aspect of the present disclosure, wherein the base station assumes that a probability that a receiver incorrectly decodes the first bit sub-block based on a first hypothesis is no higher than a first threshold, the first hypothesis is that the number of bits in the second bit sub-block is equal to a maximum value of the K candidate values.

In one embodiment, an advantage of the above method is that the reliability of transmission of the first bit sub-block is guaranteed.

In one embodiment, a receiver of the first radio signal calculates a first coding rate based on the receiver, and notifies the base station of the first coding rate, the base station performs the channel coding on the first bit block based on the first coding rate. A coding rate for the first bit block less than or equal to the first coding rate is one of prerequisites for that a probability that the first bit sub-block is incorrectly decoded based on the first hypothesis is no higher than a first threshold.

In one embodiment, a receiver of the first radio signal calculates a first Signal-to-Noise Ratio (SNR) based on the receiver, and notifies the base station of the first SNR, the base station configures a transmitting power of the first radio signal based on the first SNR. An SNR for the first radio signal greater than or equal to the first SNR is one of prerequisites for that a probability that the first bit sub-block is incorrectly decoded based on the first hypothesis is no higher than a first threshold.

In one embodiment, a receiver of the first radio signal calculates a first modulation mode based on the receiver, and notifies the base station of the first modulation mode, the base station configures a modulation mode of the first radio signal based on the first modulation mode. A modulation mode of the first radio signal having higher reliability than the first modulation mode is one of prerequisites for that a probability that the first bit sub-block is incorrectly decoded based on the first hypothesis is no higher than a first threshold.

In one embodiment, at least one of a coding rate for the first bit block, a modulation mode of the first radio signal or a transmitting power of the first radio signal is a condition for meeting the assumption.

Specifically, according to one aspect of the present disclosure, further comprising:

determining a number of bit(s) in a third bit sub-block.

Herein, the first bit block also comprises the bit(s) in the third bit sub-block, the bit(s) in the third bit sub-block is(are) frozen bit(s), a maximum value of the K candidate values is related to the number of the bit(s) in the third bit sub-block.

In one embodiment, an advantage of the above method is that the reliability of transmission of the first bit sub-block is further guaranteed.

In one embodiment, positions of bits in the third bit sub-block in the first bit block are non-consecutive.

In one embodiment, positions of bits in the third bit sub-block in the first bit block are consecutive.

In one embodiment, a number of bit(s) in the third bit sub-block ensures that a probability that the receiver incorrectly decodes the first bit sub-block based on the first hypothesis is no higher than a first threshold.

In one embodiment, a number of bit(s) in the first bit sub-block is L1. A number of bits in the second bit sub-block is L2. A number of bit(s) in the third bit sub-block is equal to L−L1−L2. The L, the L1 and the L2 are positive integers, respectively, wherein the L is greater than L1+L2.

In one embodiment, the base station configures P1 Control Channel Elements (CCEs) to the first bit block based on the first threshold, a number of bits in code words that the P1 CCEs bear is the L.

In one embodiment, a number of bit(s) in the third bit sub-block ensures that a probability that a receiver incorrectly decodes the first bit sub-block based on a second hypothesis is no higher than a second threshold. The second hypothesis is that: the first bit sub-block received according to the first hypothesis is correctly decoded, and is used for determining a number of bits in the second bit sub-block.

In one embodiment, the first threshold is less than the second threshold.

In one embodiment, the first threshold is equal to the second threshold.

In one embodiment, the first bit sub-block received is the same as the first bit sub-block transmitted by the base station (i.e., the first bit sub-block is correctly decoded).

In one embodiment, the first bit sub-block received is different from the first bit sub-block transmitted by the base station (i.e., the first bit sub-block is incorrectly decoded).

In one embodiment, at least one of Uplink Control Information (UCI) fed back from a receiver of the first radio signal, a modulation mode of the first radio signal, or a transmitting power of the first radio signal is used for determining a number of bit(s) in the third bit sub-block.

Specifically, according to one aspect of the present disclosure, wherein the second bit sub-block comprises a first bit set and a second bit set. Bit(s) in the first bit sub-block and bit(s) in the first bit set are used for generating the second bit set.

In one embodiment, an advantage of the above method is that the second bit set is a redundancy check on the first bit sub-block and the first bit set, which helps enhance transmission reliability.

In one embodiment, bits in the second bit set are Circular Redundancy Check (CRC) bits for bit(s) in the first bit sub-block and bits in the second bit sub-block.

In one embodiment, bits in the second bit set are Parity Check (PC) bits for bit(s) in the first bit sub-block and bits in the second bit sub-block.

In one embodiment, bits in the second bit set correspond to a CRC Generation Polynomial, inputs to the CRC Generation Polynomial are bit(s) in the first bit sub-block and bits in the second bit sub-block.

In one embodiment, bits in the second bit set correspond to two CRC Generation Polynomials, inputs to the two CRC Generation Polynomials are respectively bit(s) in the first bit sub-block and bits in the second bit sub-block.

Specifically, according to one aspect of the present disclosure, wherein a value of the first bit sub-block is used for determining at least one of a position(s) of bits in the second bit sub-block in the first bit block, an information format of the second bit sub-block and a polynomial corresponding to a redundancy check bit(s) in the first bit block.

In one embodiment, an advantage of the above method is that more flexible configuration can be provided to the second bit sub-block so as to reduce extra signaling overhead.

In one embodiment, the first bit sub-block explicitly indicates a position(s) of bits in the second bit sub-block in the first bit block.

In one embodiment, the first bit sub-block implicitly indicates a position(s) of bits in the second bit sub-block in the first bit block.

In one embodiment, a value of the first bit sub-block indicates relative positions of the second bit sub-block and the first bit sub-block.

In one embodiment, a value of the first bit sub-block explicitly indicates an information format of the second bit sub-block.

In one embodiment, a value of the first bit sub-block implicitly indicates an information format of the second bit sub-block.

In one embodiment, a value of the first bit sub-block is used for partially determining an information format of the second bit block.

In one embodiment, a value of the first bit sub-block explicitly indicates a polynomial corresponding to a redundancy check bit(s) in the first bit block.

In one embodiment, a value of the first bit sub-block implicitly indicates a polynomial corresponding to a redundancy check bit(s) in the first bit block.

Specifically, according to one aspect of the present disclosure, wherein an average of channel capacity(capacities) of sub-channel(s) mapped by the bit(s) in the first bit sub-block is greater than an average of channel capacities of sub-channels mapped by the bits in the second bit sub-block.

In one embodiment, an advantage of the above method is that the reliability of transmission of the first bit sub-block can be better guaranteed.

In one embodiment, a channel capacity of a sub-channel mapped by any bit in the first bit sub-block is greater than a channel capacity of a sub-channel mapped by any bit in the second bit sub-block.

In one embodiment, a channel capacity of at least one sub-channel of sub-channel(s) mapped by the bit(s) in the first bit sub-block is smaller than a channel capacity of at least one sub-channel of sub-channel(s) mapped by the bits in the second bit sub-block, an average of channel capacity (capacities) of sub-channel(s) mapped by the bit(s) in the first bit sub-block is greater than an average of channel capacities of sub-channels mapped by the bits in the second bit sub-block.

Specifically, according to one aspect of the present disclosure, wherein the first radio signal is transmitted on a physical layer control channel, or the first bit sub-block and the second bit sub-block belong to same DCI.

In one embodiment, an advantage of the above method is that the number of blind detections on a physical layer control channel at the UE side can be decreased.

In one embodiment, the physical layer control channel is a physical layer channel that can only bear a physical layer signaling.

In one embodiment, the DCI is UE-specific.

In one embodiment, the physical layer control channel is a PDCCH.

In one embodiment, the physical layer control channel is an enhanced PDCCH (ePDCCH).

In one embodiment, the physical layer control channel is a short PDCCH (sPDCCH).

In one embodiment, the physical layer control channel is a New Radio PDCCH (NR-PDCCH).

The present disclosure discloses a method in a UE for wireless communication, comprising:
receiving a first radio signal; and
performing channel decoding.

Herein, a channel coding corresponding to the channel decoding is based on a polar code, a first bit block is used for an input to the channel coding; an output after the channel coding is used for generating the first radio signal. The channel decoding is used for recovering the first bit block. The first bit block comprises bit(s) in a first bit sub-block and bit(s) in a second bit sub-block. A value of the first bit sub-block is related to a number of bits in the second bit sub-block; or, a value of the first bit sub-block is related to a number of bits in the first bit block. A position(s) of the bit(s) in the first bit sub-block in the first bit block is(are) determined by default. The first bit sub-block and the second bit sub-block respectively comprise a positive integer number of bit(s). The number of bits in the second bit sub-block is a candidate value of the K candidate values. The candidate value is a positive integer, the K is a positive integer greater than 1.

In one embodiment, the first radio signal carries check information of the first bit block, the channel decoding determines based on the check information whether the first bit block is correctly recovered.

In one embodiment, the first bit block comprises check information of an information bit in the first bit block, the channel decoding determines based on the check information whether the first bit block is correctly recovered.

In one embodiment, the UE sequentially performs pre-decoding on the first radio signal to acquire the first bit sub-block, uses a value of the first bit sub-block for determining a position of the second bit sub-block in the first bit block, and then applies a value of the first bit sub-block and a position of the second bit sub-block to further decoding of the first radio signal so as to recover the first bit block.

Specifically, according to one aspect of the present disclosure, further comprising:
receiving first information.

Herein, the first information is used for determining the number of bit(s) in the first bit sub-block and the K candidate values.

Specifically, according to one aspect of the present disclosure, further comprising:
receiving first information.

Herein, the first information is used for determining the number of bit(s) in the first bit sub-block.

Specifically, according to one aspect of the present disclosure, further comprising:
receiving first information.

Herein, the first information is used for determining the K candidate values.

Specifically, according to one aspect of the present disclosure, further comprising:
performing channel pre-decoding based on a first hypothesis.

Herein, an output after the channel pre-decoding comprises the first bit sub-block, the first hypothesis is that the number of bits in the second bit sub-block is equal to a maximum value of the K candidate values.

In one embodiment, the channel decoding is based on a second hypothesis, the second hypothesis is that: the first bit sub-block received according to the first hypothesis is correctly decoded, and is used for determining a number of bits in the second bit sub-block.

In one embodiment, an algorithm employed by the channel pre-decoding is the same as an algorithm employed by the channel decoding despite that fact that the former algorithm assumes different numbers of frozen bits in the first bit block.

In one embodiment, the first hypothesis is used for determining a number of frozen bits and positions of the frozen bits in the channel pre-decoding.

In one embodiment, a value of the first bit sub-block is used for determining a number of frozen bits and positions of the frozen bits in the channel decoding.

In one embodiment, a value of the first bit sub-block is used as a frozen bit in the channel decoding.

Specifically, according to one aspect of the present disclosure, further comprising:
determining a number of bit(s) in a third bit sub-block.

Herein, the first bit block also comprises the bit(s) in the third bit sub-block, the bit(s) in the third bit sub-block is(are) frozen bit(s). A maximum value of the K candidate values is related to the number of the bit(s) in the third bit sub-block.

In one embodiment, a number of bit(s) in a third bit sub-block is determined after the channel pre-decoding is performed on the basis of the first hypothesis and prior to performing the channel decoding.

In one embodiment, a number of bit(s) in the third bit sub-block ensures that a probability that the receiver incorrectly decodes the first bit sub-block based on the first hypothesis is no higher than a first threshold.

In one embodiment, a number of bit(s) in the first bit sub-block is L1. A number of bits in the second bit sub-block is L2. A number of bit(s) in the third bit sub-block is equal to L−L1−L2. The L, the L1 and the L2 are positive integers, respectively, wherein the L is greater than L1+L2.

Specifically, according to one aspect of the present disclosure, wherein the second bit sub-block comprises a first bit set and a second bit set. Bit(s) in the first bit sub-block and bit(s) in the first bit set are used for generating the second bit set.

In one embodiment, bits in the second bit set are used for performing check on bit(s) in the first bit sub-block and bit(s) in the first bit set so as to determine whether reception is correct.

Specifically, according to one aspect of the present disclosure, wherein a value of the first bit sub-block is used for determining at least one of a position(s) of bits in the second bit sub-block in the first bit block, an information format of the second bit sub-block and a polynomial corresponding to a redundancy check bit(s) in the first bit block.

Specifically, according to one aspect of the present disclosure, wherein an average of channel capacity(capacities) of sub-channel(s) mapped by the bit(s) in the first bit sub-block is greater than an average of channel capacities of sub-channels mapped by the bits in the second bit sub-block.

Specifically, according to one aspect of the present disclosure, wherein the first radio signal is transmitted on a physical layer control channel, or the first bit sub-block and the second bit sub-block belong to same DCI.

The present disclosure discloses a base station used for wireless communication, comprising:
a first executor, performing channel coding; and
a first transmitter, transmitting a first radio signal.

Herein, a first bit block is used for an input to the channel coding. The channel coding is based on a polar code. An output after the channel coding is used for generating the first radio signal. The first bit block comprises bit(s) in a first bit sub-block and bit(s) in a second bit sub-block. A value of the first bit sub-block is related to a number of bits in the second bit sub-block; or, a value of the first bit sub-block is related to a number of bits in the first bit block. A position(s) of the bit(s) in the first bit sub-block in the first bit block is(are) determined by default. The first bit sub-block and the second bit sub-block respectively comprise a positive integer number of bit(s). The number of bits in the second bit sub-block is a candidate value of the K candidate values. The candidate value is a positive integer, the K is a positive integer greater than 1.

In one embodiment, the above base station is characterized in that the first executor also transmits first information. Herein, the first information is used for determining the number of bit(s) in the first bit sub-block and the K candidate values.

In one embodiment, the above base station is characterized in that the first executor also transmits first information. Herein, the first information is used for determining the number of bit(s) in the first bit sub-block.

In one embodiment, the above base station is characterized in that the first executor also transmits first information. Herein, the first information is used for determining the K candidate values.

In one embodiment, the above base station is characterized in that the base station assumes that a probability that a receiver incorrectly decodes the first bit sub-block based on a first hypothesis is no higher than a first threshold, the first hypothesis is that the number of bits in the second bit sub-block is equal to a maximum value of the K candidate values.

In one embodiment, the above base station is characterized in that the first executor determines a number of bit(s) in a third bit sub-block. Herein, the first bit block also comprises the bit(s) in the third bit sub-block, the bit(s) in the third bit sub-block is(are) frozen bit(s). A maximum value of the K candidate values is related to the number of the bit(s) in the third bit sub-block.

In one embodiment, the above base station is characterized in that the second bit sub-block comprises a first bit set and a second bit set. Bit(s) in the first bit sub-block and bit(s) in the first bit set are used for generating the second bit set.

In one embodiment, the above base station is characterized in that the a value of the first bit sub-block is used for determining at least one of a position(s) of bits in the second bit sub-block in the first bit block, an information format of the second bit sub-block and a polynomial corresponding to a redundancy check bit(s) in the first bit block.

In one embodiment, the above base station is characterized in that an average of channel capacity(capacities) of sub-channel(s) mapped by the bit(s) in the first bit sub-block is greater than an average of channel capacities of sub-channels mapped by the bits in the second bit sub-block.

In one embodiment, the above base station is characterized in that the first radio signal is transmitted on a physical layer control channel, or the first bit sub-block and the second bit sub-block belong to same DCI.

The present disclosure discloses a UE used for wireless communication, comprising:
a first receiver, receiving a first radio signal; and
a second executor, performing channel decoding;
wherein a channel coding corresponding to the channel decoding is based on a polar code, a first bit block is used for an input to the channel coding. An output after the channel coding is used for generating the first radio signal. The channel decoding is used for recovering the first bit block. The first bit block comprises bit(s) in a first bit sub-block and bit(s) in a second bit sub-block. A value of the first bit sub-block is related to a number of bits in the second bit sub-block; or, a value of the first bit sub-block is related to a number of bits in the first bit block. A position(s) of the bit(s) in the first bit sub-block in the first bit block is(are) determined by default. The first bit sub-block and the second bit sub-block respectively comprise a positive integer number of bit(s). The number of bits in the second bit sub-block is a candidate value of the K candidate values. The candidate value is a positive integer, the K is a positive integer greater than 1.

In one embodiment, the above UE is characterized in that the first receiver also receives first information. Herein, the first information is used for determining the number of bit(s) in the first bit sub-block and the K candidate values.

In one embodiment, the above UE is characterized in that the first receiver also receives first information. Herein, the first information is used for determining the number of bit(s) in the first bit sub-block.

In one embodiment, the above UE is characterized in that the first receiver also receives first information. Herein, the first information is used for determining the K candidate values.

In one embodiment, the above UE is characterized in that the first receiver also performs channel pre-decoding based on a first hypothesis. Herein, an output after the channel pre-decoding comprises the first bit sub-block, the first hypothesis is that the number of bits in the second bit sub-block is equal to a maximum value of the K candidate values.

In one embodiment, the above UE is characterized in that the first receiver also determines a number of bit(s) in a third bit sub-block. Herein, the first bit block also comprises the bit(s) in the third bit sub-block, the bit(s) in the third bit sub-block is(are) frozen bit(s). A maximum value of the K candidate values is related to the number of the bit(s) in the third bit sub-block.

In one embodiment, the above UE is characterized in that the second bit sub-block comprises a first bit set and a second bit set. Bit(s) in the first bit sub-block and bit(s) in the first bit set are used for generating the second bit set.

In one embodiment, the above UE is characterized in that a value of the first bit sub-block is used for determining at least one of a position(s) of bits in the second bit sub-block in the first bit block, an information format of the second bit sub-block and a polynomial corresponding to a redundancy check bit(s) in the first bit block.

In one embodiment, the above UE is characterized in that an average of channel capacity(capacities) of sub-channel(s) mapped by the bit(s) in the first bit sub-block is greater than an average of channel capacities of sub-channels mapped by the bits in the second bit sub-block.

In one embodiment, the above UE is characterized in that the first radio signal is transmitted on a physical layer control channel, or the first bit sub-block and the second bit sub-block belong to same DCI.

In one embodiment, the present disclosure has the following advantages over conventional schemes:

utilizing features of polar codes, decreasing the number of blind detections at the UE side through internal indication of a code block;

supporting more flexible and diversified DCI formats; and ensuring reliability of DCI transmission.

BRIEF DESCRIPTION OF THE DRAWINGS

Other features, objects and advantages of the present disclosure will become more apparent from the detailed description of non-restrictive embodiments taken in conjunction with the following drawings.

EMBODIMENT 1

Figure 1:
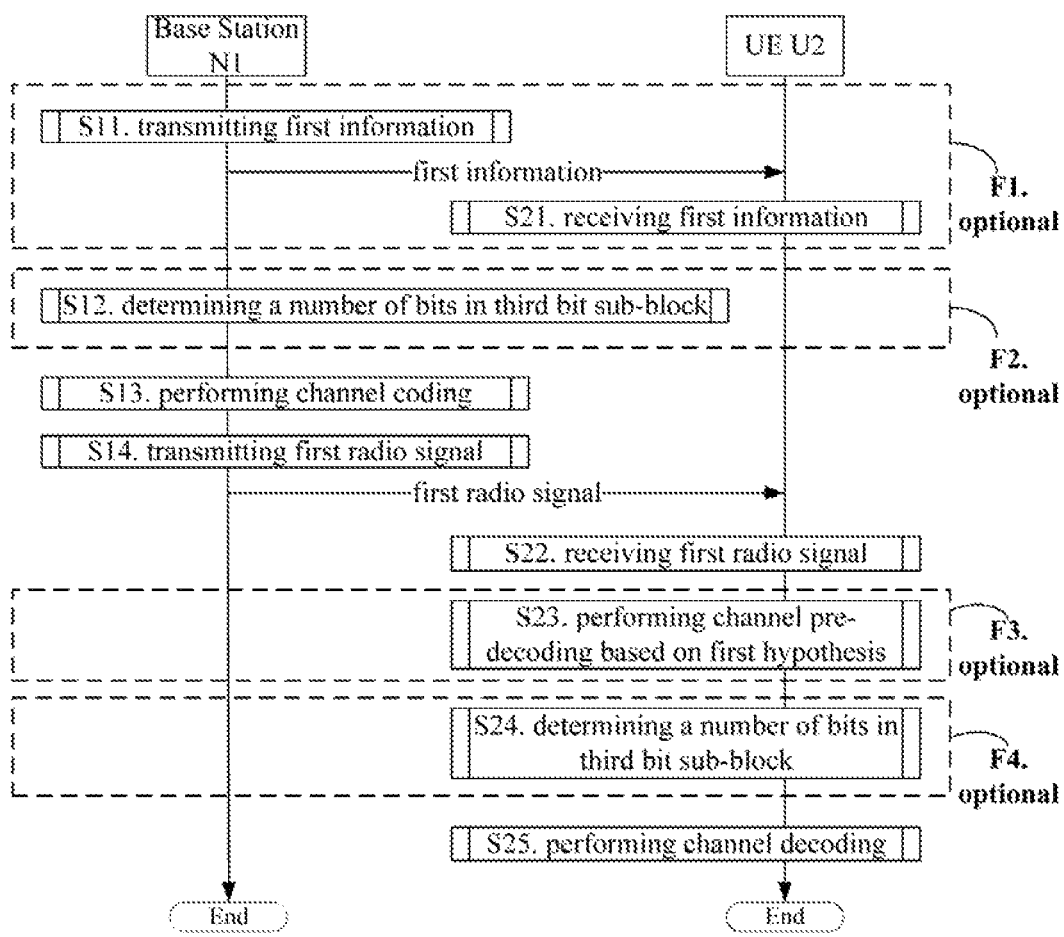
FIG. 1 illustrates a flowchart of wireless transmission according to one embodiment of the present disclosure.

Embodiment 1 illustrates a flowchart of wireless transmission, as shown in FIG. 1. In FIG. 1, a base station N1 is a maintenance base station for a serving cell of a UE U2. In FIG. 1, steps in box F1, box F2, box F3 and box F4 are optional, respectively.

The N1 transmits first information in step S11; determines a number of bit(s) in a third bit sub-block in step S12; performs channel coding in step S13; and transmits a first radio signal in step S14.

The U2 receives first information in step S21; receives a first radio signal in step S22; performs channel pre-decoding based on a first hypothesis in step S23; determines a number of bit(s) in a third bit sub-block in step S24; and performs channel decoding in step S25.

In Embodiment 1, a first bit block is used by the N1 for an input to channel coding. The channel coding is based on a polar code; an output after the channel coding is used by the N1 for generating the first radio signal. A channel coding corresponding to a channel decoding is based on a polar code. The channel decoding is used by the U2 for recovering the first bit block. The first bit block comprises bit(s) in a first bit sub-block and bit(s) in a second bit sub-block; a value of the first bit sub-block is related to a number of bits in the second bit sub-block, or, a value of the first bit sub-block is related to a number of bits in the first bit block. A position(s) of the bit(s) in the first bit sub-block in the first bit block is(are) determined by default. The first bit sub-block and the second bit sub-block respectively comprise a positive integer number of bit(s). The number of bits in the second bit sub-block is a candidate value of the K candidate values; the candidate value is a positive integer; the K is a positive integer greater than 1.

In one embodiment, steps in the box F1 are chosen, the first information is used by the U2 for determining at least one of a number of bit(s) in the first bit sub-block or the K candidate values.

In one embodiment, the N1 assumes that a probability that a receiver of the U2 incorrectly decodes the first bit sub-block based on a first hypothesis is no higher than a first threshold, the first hypothesis is that the number of bits in the second bit sub-block is equal to a maximum value of the K candidate values.

In one embodiment, the box F2 is chosen, the first bit block also comprises the bit(s) in the third bit sub-block, the bit(s) in the third bit sub-block is(are) frozen bit(s). A maximum value of the K candidate values is related to the number of the bit(s) in the third bit sub-block.

In one embodiment, the second bit sub-block comprises a first bit set and a second bit set. Bit(s) in the first bit sub-block and bit(s) in the first bit set are used for generating the second bit set.

In one embodiment, a value of the first bit sub-block is used by the U2 for determining at least one of a position(s) of bits in the second bit sub-block in the first bit block, an information format of the second bit sub-block and a polynomial corresponding to a redundancy check bit(s) in the first bit block.

In one embodiment, an average of channel capacity (capacities) of sub-channel(s) mapped by the bit(s) in the first bit sub-block is greater than an average of channel capacities of sub-channels mapped by the bits in the second bit sub-block.

In one embodiment, the first radio signal is transmitted on a physical layer control channel.

In one embodiment, the first bit sub-block and the second bit sub-block belong to same DCI.

In one embodiment, the box F3 is chosen, an output after the channel pre-decoding comprises the first bit sub-block, the first hypothesis is that the number of bits in the second bit sub-block is equal to a maximum value of the K candidate values.

In one embodiment, the box F4 is chosen, the first bit block also comprises the bit(s) in the third bit sub-block, the bit(s) in the third bit sub-block is(are) frozen bit(s). A maximum value of the K candidate values is related to the number of the bit(s) in the third bit sub-block.

Any combination of the above sub-embodiments constitutes other sub-embodiments of Embodiment 1.

EMBODIMENT 2

Figure 2:
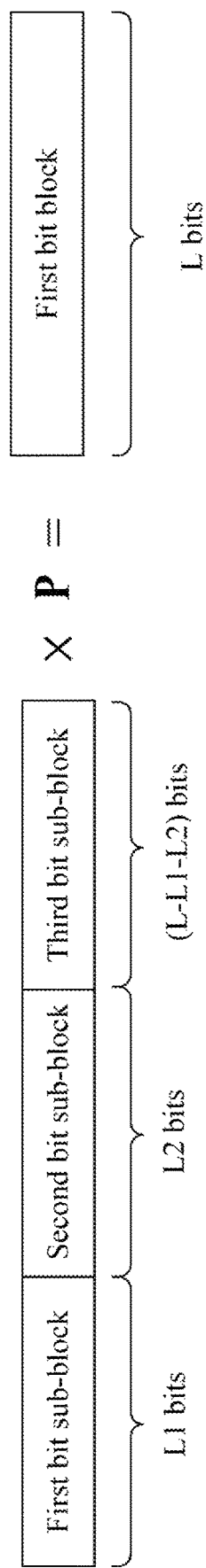
FIG. 2 illustrates a schematic diagram of constructing a first bit block according to one embodiment of the present disclosure.

Embodiment 2 illustrates a schematic diagram of constructing a first bit block, as shown in FIG. 2.

In Embodiment 2, a first bit block is an input to channel coding, bits in the first bit block consist of bit(s) in the first bit sub-block, bits in the second bit sub-block and bit(s) in the third bit sub-block. A number of bits in the first bit block is L, a number of bit(s) in the first bit sub-block is L1, a number of bits in the second bit sub-block is L2. A base station calculates based on the L, the L1 and the L2 that a number of bit(s) in the third bit sub-block is equal to L−L1−L2. The bit(s) in the third bit sub-block is(are) frozen bit(s). The frozen bit(s) are bit(s) having default value(s). The base station constructs a Permutation Matrix P with L rows and L columns, cascades the first bit sub-block, the second bit sub-block and the third bit sub-block to acquire a bit sequence of a length of L, and then multiplies the bit sequence by the Permutation Matrix P to get the first bit block. The Permutation Matrix P refers to that any row or column of a matrix only comprises one 1, with others equal to 0.

In one embodiment, bits in the first bit sub-block are consecutive in the first bit block.

In one embodiment, bits in the first bit sub-block are non-consecutive in the first bit block.

In one embodiment, bits in the second bit sub-block are consecutive in the first bit block.

In one embodiment, bits in the second bit sub-block are non-consecutive in the first bit block.

In one embodiment, bits in the third bit sub-block are consecutive in the first bit block.

In one embodiment, bits in the third bit sub-block are non-consecutive in the first bit block.

EMBODIMENT 3

Figure 3:
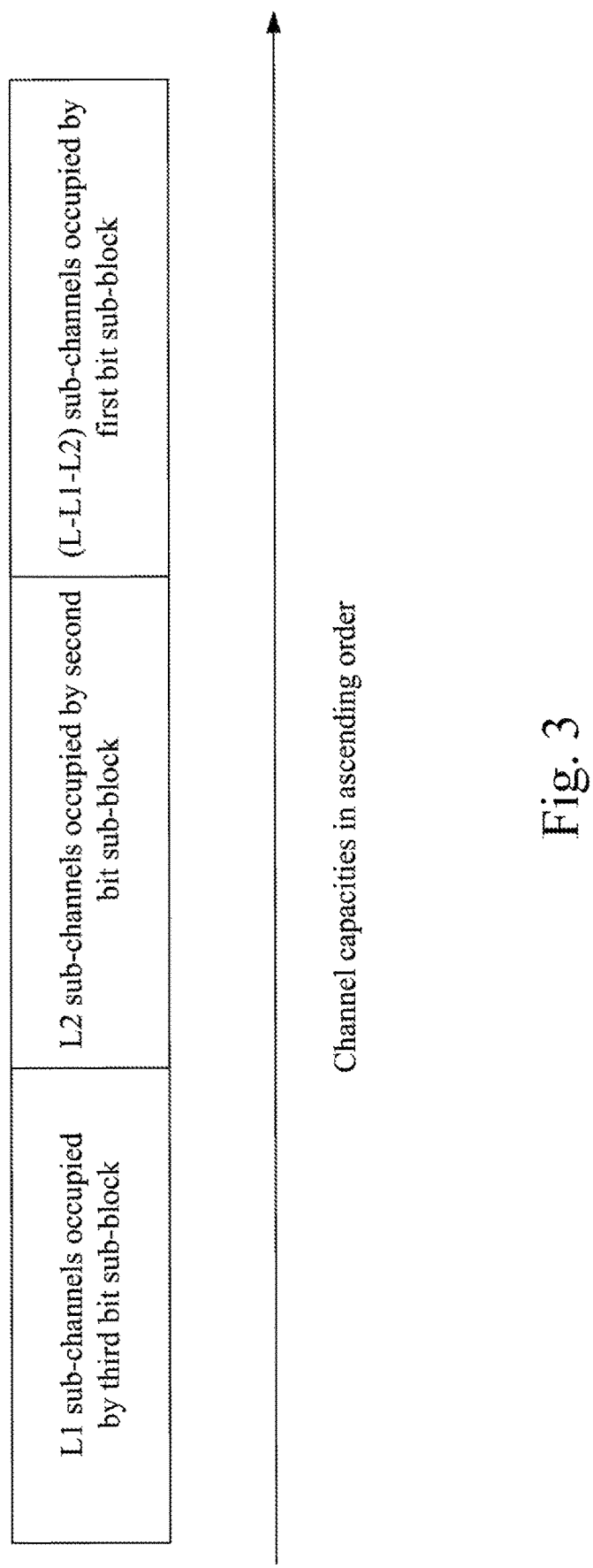
FIG. 3 illustrates a schematic diagram illustrating mapping relations of a first bit sub-block, a second bit sub-block and a third bit sub-block to sub-channels according to one embodiment of the present disclosure.

Embodiment 3 illustrates a schematic diagram illustrating mapping relations of a first bit sub-block, a second bit sub-block and a third bit sub-block to sub-channels, as shown in FIG. 3.

In Embodiment 3, the number of bits in the first bit block is L, the number of bit(s) in the first bit sub-block is L1, the number of bits in the second bit sub-block is L2, the number of bit(s) in the third bit sub-block is L−L1−L2. Bit(s) in the first bit sub-block respectively corresponds(correspond) to L1 sub-channel(s), bits in the second bit sub-block respectively corresponds(correspond) to L2 sub-channel(s), bit(s) in the third bit sub-block respectively corresponds(correspond) to L−L1−L2 sub-channel(s). A channel capacity corresponding to any sub-channel of the L1 sub-channel(s) is higher than a channel capacity corresponding to any sub-channel of the L2 sub-channel(s), and a channel capacity corresponding to any sub-channel of the L2 sub-channel(s) is higher than a channel capacity corresponding to any sub-channel of the (L−L1−L2) sub-channel(s).

EMBODIMENT 4

Figure 4:
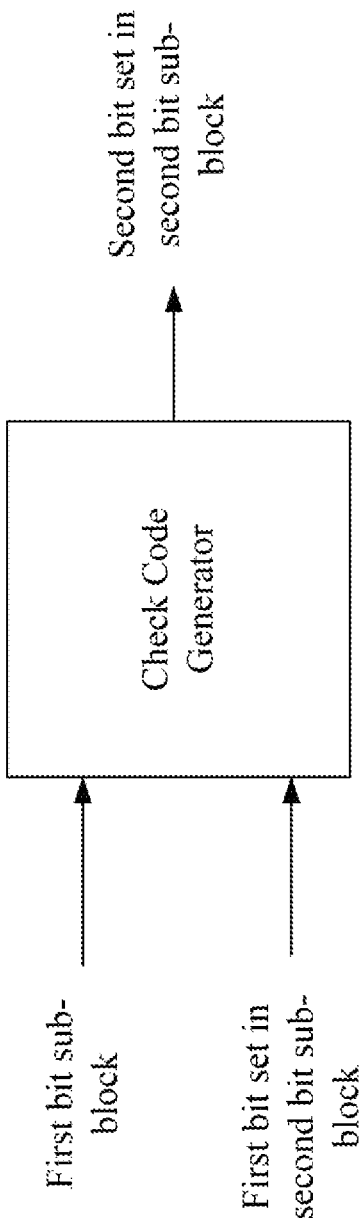
FIG. 4 illustrates a schematic diagram illustrating relations between a first bit sub-block and a second bit set in a second bit sub-block, and between a first bit set in a second bit sub-block and a second bit set in a second bit sub-block according to one embodiment of the present disclosure.

Embodiment 4 illustrates a schematic diagram illustrating relations between a first bit sub-block and a second bit set in a second bit sub-block, and between a first bit set in a second bit sub-block and a second bit set in a second bit sub-block, as shown in FIG. 4.

In Embodiment 4, a first bit sub-block and a first bit set in the second bit sub-block are an input to a check code generator, a second bit set in the second bit sub-block is an output from the check code generator.

In one embodiment, the check code generator is a CRC code generator, the second bit set is a CRC code for the first bit sub-block and the first bit set.

In one embodiment, the check code generator is a PC code generator, the second bit set is a PC code for the first bit sub-block and the first bit set.

EMBODIMENT 5

Figure 5:
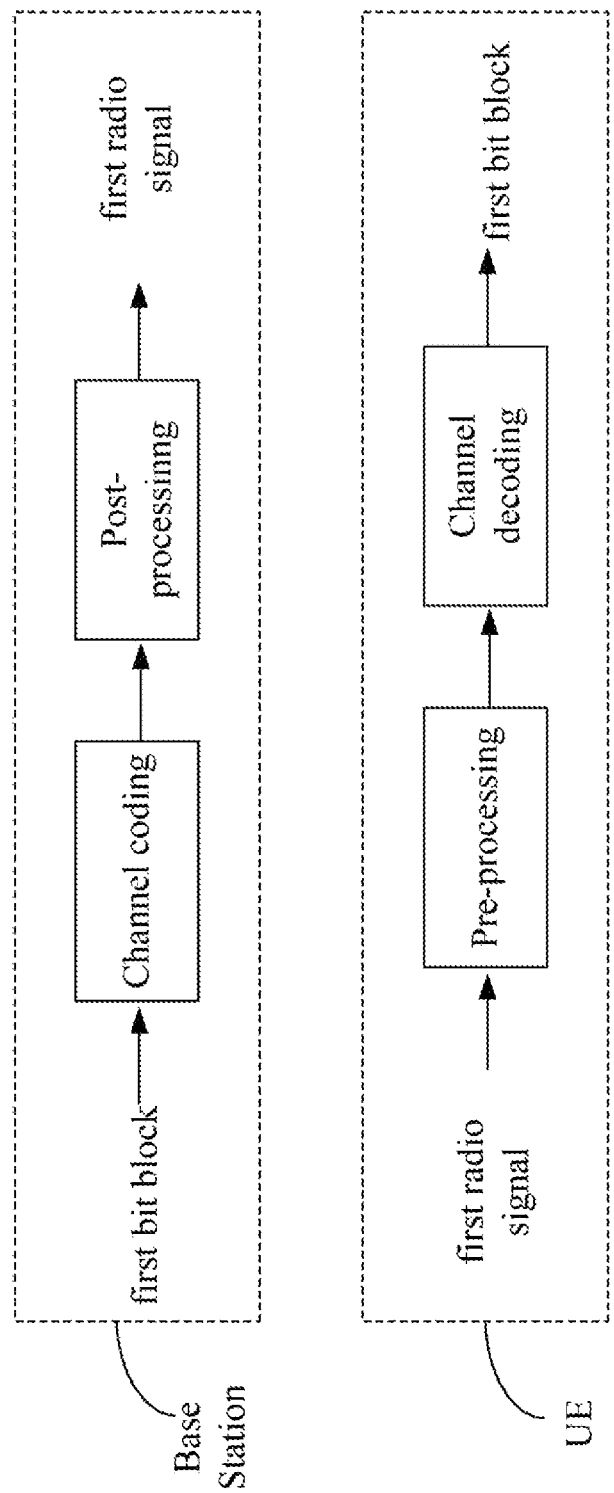
FIG. 5 illustrates a schematic diagram illustrating a relation between a first bit block and a first radio signal according to one embodiment of the present disclosure.

Embodiment 5 illustrates a schematic diagram illustrating a relation between a first bit block and a first radio signal, as shown in FIG. 5.

In Embodiment 5, on the base station side, a first bit block is an input to a channel coding module, an output from the channel coding module is subjected to a post-processing module to acquire a first radio signal. At the UE side, an output after the first radio signal is subjected to a pre-processing module is used for input to a channel decoding module, the first bit block is an output from the channel decoding module. The channel coding module is a polar code encoder. The channel decoding module is a polar code decoder.

In one embodiment, the first radio signal is an OFDM symbol bearing the first bit block, post-processes in the post-processing module include operations of modulation and mapping, multi-antenna precoding, Resource Element (RE) mapping and OFDM signal generation.

In one embodiment, the first radio signal is an OFDM symbol bearing the first bit block, pre-processes in the pre-processing module include operations of OFDM signal demodulation, channel estimation, channel equalization, RE de-mapping and demodulation mapping.

In one embodiment, an output after the channel coding is a product of the first bit block and a Kronecker matrix.

In one embodiment, an output after the channel coding is a product of a Kronecker matrix and a bit sequence formed after indices of the bits in the first bit block are reversed.

In one embodiment, the channel decoding module is a Successive Cancelation (SC) decoder.

In one embodiment, the channel decoding module is a Successive Cancellation List (SCL) decoder.

In one embodiment, the channel decoding module is a Successive Cancellation Stack (SCS) decoder.

EMBODIMENT 6

Figure 6:
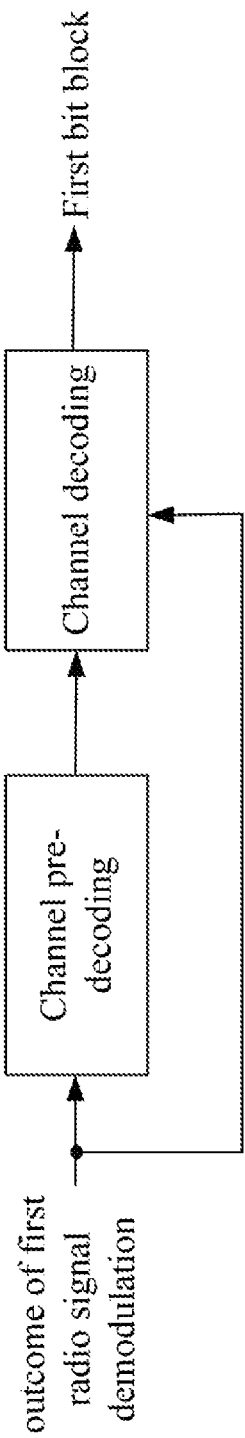
FIG. 6 illustrates a schematic diagram of channel pre-decoding and channel decoding according to one embodiment of the present disclosure.

Embodiment 6 illustrates a schematic diagram of channel pre-decoding and channel decoding, as shown in FIG. 6.

In Embodiment 6, a result of demodulating a first radio signal is used for an input to a channel pre-decoding module, an output from the channel pre-decoding module and the result of demodulating the first radio signal are used for an input to a channel decoding module, a first bit block is an outcome output by the channel decoding module. A first polar code decoder and a second polar code decoder are respectively used for the channel pre-decoding module and the channel decoding module. In the channel pre-decoding module, position(s) of bit(s) in a first bit sub-block is(are) combined with an output from the first polar code decoder to be used for determining a value of the first bit sub-block. The output from the channel decoding module includes a number of bits in the second bit sub-block and position(s) of bits in the second bit sub-block in the first bit block, and a number of bit(s) in the third bit sub-block and position(s) of bit(s) in the third bit sub-block in the first bit block. A value of the first bit sub-block is used for calculating an output from the channel decoding module. Bit(s) in the third bit sub-block is(are) frozen bit(s), the frozen bit refers to a bit not carrying information, whose value is a value by default.

In one embodiment, the first polar code decoder and the second polar code decoder are different polar code decoders.

In one embodiment, the first polar code decoder and the second polar code decoder are one same polar code decoder.

In one embodiment, the channel pre-decoding module does not comprise a step of utilizing redundancy check codes for checking, the channel decoding module comprises a step of utilizing redundancy check codes for checking.

In one embodiment, the redundancy check code is a CRC code.

In one embodiment, the redundancy check code is a PC code.

In one embodiment, a value of the first bit sub-block is used as a frozen bit in the channel decoding module.

EMBODIMENT 7

Figure 7:
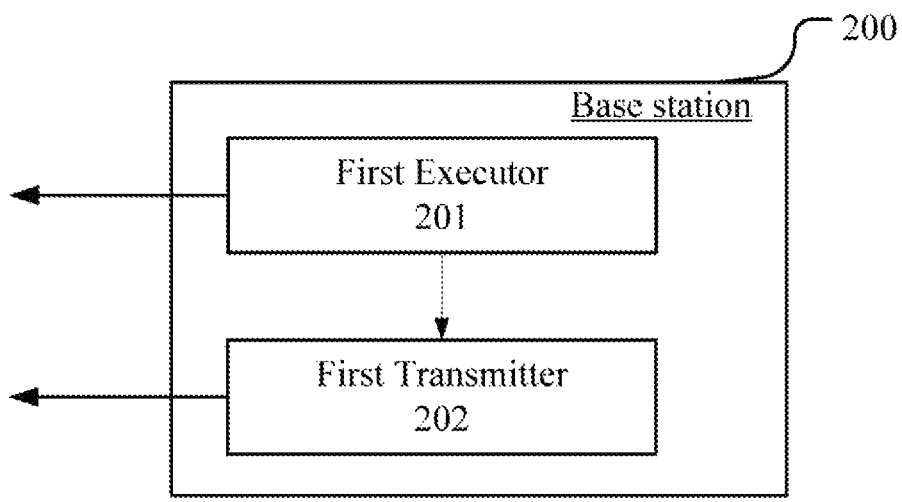
FIG. 7 illustrates a structure block diagram of a processing device used in a base station according to one embodiment of the present disclosure.

Embodiment 7 illustrates a structure block diagram of a processing device used in a base station, as shown in FIG. 7. In FIG. 7, a base station 200 mainly consists of a first executor 201 and a first transmitter 202.

In Embodiment 7, a first executor 201 performs channel coding, a first transmitter 202 transmits a first radio signal.

In Embodiment 7, a first bit block is used for an input to the channel coding. The channel coding is based on a polar code. An output after the channel coding is used for generating the first radio signal. The first bit block comprises bit(s) in a first bit sub-block and bit(s) in a second bit sub-block. A value of the first bit sub-block is related to a number of bits in the second bit sub-block; or, a value of the first bit sub-block is related to a number of bits in the first bit block. A position(s) of the bit(s) in the first bit sub-block in the first bit block is(are) determined by default. The first bit sub-block and the second bit sub-block respectively comprise a positive integer number of bit(s). The number of bits in the second bit sub-block is a candidate value of the K candidate values. The candidate value is a positive integer, the K is a positive integer greater than 1.

In one embodiment, a first executor 201 further transmits first information. Herein, the first information is used for determining at least one of a number of bit(s) in the first bit sub-block, or the K candidate values.

In one embodiment, the base station assumes that a probability that a receiver incorrectly decodes the first bit sub-block based on a first hypothesis is no higher than a first threshold, the first hypothesis is that the number of bits in the second bit sub-block is equal to a maximum value of the K candidate values.

In one embodiment, a first executor 201 further determines a number of bit(s) in a third bit sub-block. Herein, the first bit block also comprises the bit(s) in the third bit sub-block, the bit(s) in the third bit sub-block is(are) frozen bit(s). A maximum value of the K candidate values is related to the number of the bit(s) in the third bit sub-block.

In one embodiment, the second bit sub-block comprises a first bit set and a second bit set. Bit(s) in the first bit sub-block and bit(s) in the first bit set are used for generating the second bit set.

In one embodiment, a value of the first bit sub-block is used for determining at least one of a position(s) of bits in the second bit sub-block in the first bit block, an information format of the second bit sub-block and a polynomial corresponding to a redundancy check bit(s) in the first bit block.

In one embodiment, an average of channel capacity (capacities) of sub-channel(s) mapped by the bit(s) in the first bit sub-block is greater than an average of channel capacities of sub-channels mapped by the bits in the second bit sub-block.

In one embodiment, the first radio signal is transmitted on a physical layer control channel, or the first bit sub-block and the second bit sub-block belong to same DCI.

In one embodiment, the first executor 201 comprises at least one of an antenna 420, a transmitter 418, a transmitting processor 416, a multi-antenna transmitting processor 471, a controller/processor 475 or a memory 476 in Embodiment 12.

In one embodiment, the first transmitter 202 comprises at least one of an antenna 420, a transmitter 418, a transmitting processor 416, a multi-antenna transmitting processor 471, a controller/processor 475 or a memory 476 in Embodiment 12.

EMBODIMENT 8

Figure 8:
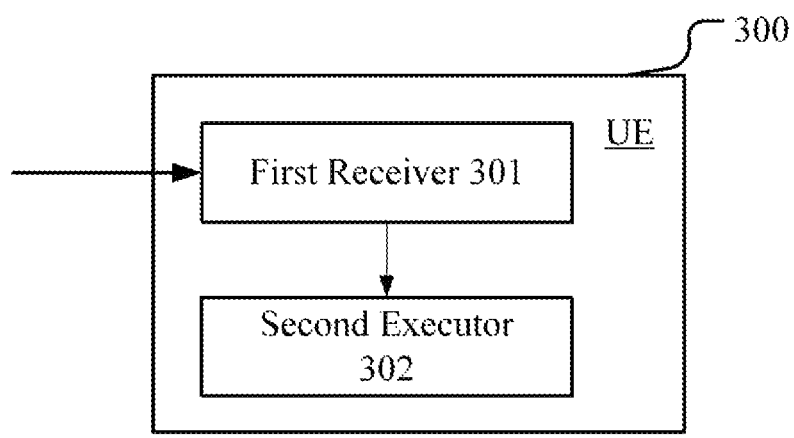
FIG. 8 illustrates a structure block diagram of a processing device used in a UE according to one embodiment of the present disclosure.

Embodiment 8 illustrates a structure block diagram of a processing device used in a UE, as shown in FIG. 8. In FIG. 8, a UE 300 mainly consists of a first receiver 301 and a second executor 302.

In Embodiment 8, a first receiver 301 receives a first radio signal; a second executor 302 performs channel decoding.

In Embodiment 8, a channel coding corresponding to the channel decoding is based on a polar code, a first bit block is used for an input to the channel coding. An output after the channel coding is used for generating the first radio signal. The first bit block comprises bit(s) in a first bit sub-block and bit(s) in a second bit sub-block. A value of the first bit sub-block is related to a number of bits in the second bit sub-block; or, a value of the first bit sub-block is related to a number of bits in the first bit block. A position(s) of the bit(s) in the first bit sub-block in the first bit block is(are) determined by default. The first bit sub-block and the second bit sub-block respectively comprise a positive integer number of bit(s). The number of bits in the second bit sub-block is a candidate value of the K candidate values. The candidate value is a positive integer, the K is a positive integer greater than 1.

In one embodiment, the first receiver 301 further receives first information. Herein, the first information is used for determining at least one of a number of bit(s) in the first bit sub-block, or the K candidate values.

In one embodiment, the first receiver 301 further performs channel pre-decoding based on a first hypothesis. Herein, an output after the channel pre-decoding comprises the first bit sub-block, the first hypothesis is that the number of bits in the second bit sub-block is equal to a maximum value of the K candidate values.

In one embodiment, the first receiver 301 further determines a number of bit(s) in a third bit sub-block. Herein, the first bit block also comprises the bit(s) in the third bit sub-block, the bit(s) in the third bit sub-block is(are) frozen bit(s). A maximum value of the K candidate values is related to the number of the bit(s) in the third bit sub-block.

In one embodiment, the second bit sub-block comprises a first bit set and a second bit set. Bit(s) in the first bit sub-block and bit(s) in the first bit set are used for generating the second bit set.

In one embodiment, a value of the first bit sub-block is used for determining at least one of a position(s) of bits in the second bit sub-block in the first bit block, an information format of the second bit sub-block and a polynomial corresponding to a redundancy check bit(s) in the first bit block.

In one embodiment, an average of channel capacity (capacities) of sub-channel(s) mapped by the bit(s) in the first bit sub-block is greater than an average of channel capacities of sub-channels mapped by the bits in the second bit sub-block.

In one embodiment, the first radio signal is transmitted on a physical layer control channel, or the first bit sub-block and the second bit sub-block belong to same DCI.

In one embodiment, the first receiver 301 comprises at least one of an antenna 452, a receiver 454, a receiving processor 456, a multi-antenna receiving processor 458, a controller/processor 459, a memory 460 or a data source 467 in Embodiment 12.

In one embodiment, the second executor 302 comprises at least one of a receiver 454, a receiving processor 456 or a multi-antenna receiving processor 458 in Embodiment 12.

EMBODIMENT 9

Figure 9:
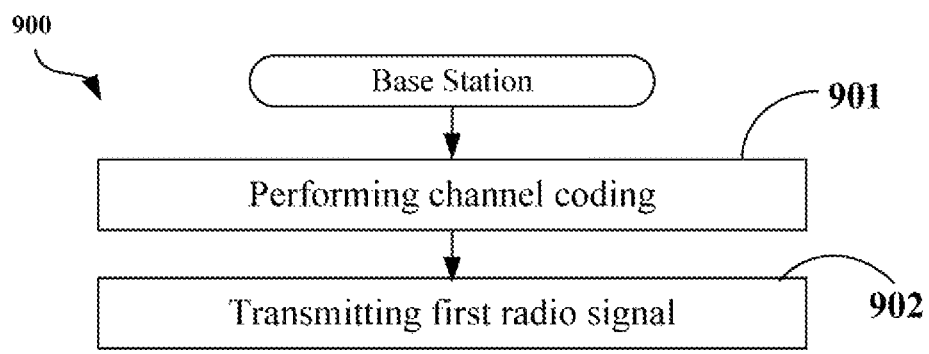
FIG. 9 illustrates a flowchart of channel coding and a first radio signal according to one embodiment of the present disclosure.

Embodiment 9 illustrates a flowchart of channel coding and a first radio signal according to one embodiment of the present disclosure; as shown in FIG. 9. In step 900 of FIG. 9, each box represents a step. Particularly, the order of steps in these boxes does not mean that there are specific chronological relations between any two steps.

In Embodiment 9, the base station in the present disclosure performs channel coding in step 901; and transmits a first radio signal in step 902. Herein, a first bit block is used for an input to the channel coding; the channel coding is based on a polar code; an output after the channel coding is used for generating the first radio signal; the first bit block comprises bit(s) in a first bit sub-block and bit(s) in a second bit sub-block; a value of the first bit sub-block is related to a number of bits in the second bit sub-block, or, a value of the first bit sub-block is related to a number of bits in the first bit block; a position(s) of the bit(s) in the first bit sub-block in the first bit block is(are) determined by default; the first bit sub-block and the second bit sub-block respectively comprise a positive integer number of bit(s); the number of bits in the second bit sub-block is a candidate value of the K candidate values; the candidate value is a positive integer, the K is a positive integer greater than 1.

In one embodiment, an output after the channel coding is subjected to modulation to generate the first radio signal.

In one embodiment, an output after the channel coding is subjected to precoding to generate the first radio signal.

In one embodiment, the first bit block is an input to the channel coding.

In one embodiment, each segment of the first bit block after segmentation is an input to the channel coding.

In one embodiment, the first bit block corresponds to part of bits in an input to the channel coding.

In one embodiment, the first bit block only comprises all information bits in an input to the channel coding.

In one embodiment, the first bit block only comprises part of information bits and check bits corresponding to the part of information bits in an input to the channel coding.

In one embodiment, the first bit block corresponds to all bits in an input to the channel coding.

In one embodiment, a value of the first bit sub-block explicitly indicates a number of bits in the second bit sub-block.

In one embodiment, a value of the first bit sub-block implicitly indicates a number of bits in the second bit sub-block.

In one embodiment, an index of the candidate value in the K candidate values is used for determining a value of the first bit sub-block.

In one embodiment, a value of the first bit sub-block explicitly indicates a number of bits in the first bit block.

In one embodiment, a value of the first bit sub-block implicitly indicates a number of bits in the first bit block.

In one embodiment, the first bit sub-block is in the forefront of the first bit block. A first bit and a second bit are any two bits in the first bit block, the first bit is before the second bit, a channel capacity of a sub-channel mapped by the first bit is greater than a channel capacity of a sub-channel mapped by the second bit.

In one embodiment, a number of bit(s) in the first bit sub-block is a constant.

In one embodiment, a number of bit(s) in the first bit sub-block is configurable.

EMBODIMENT 10

Figure 10:
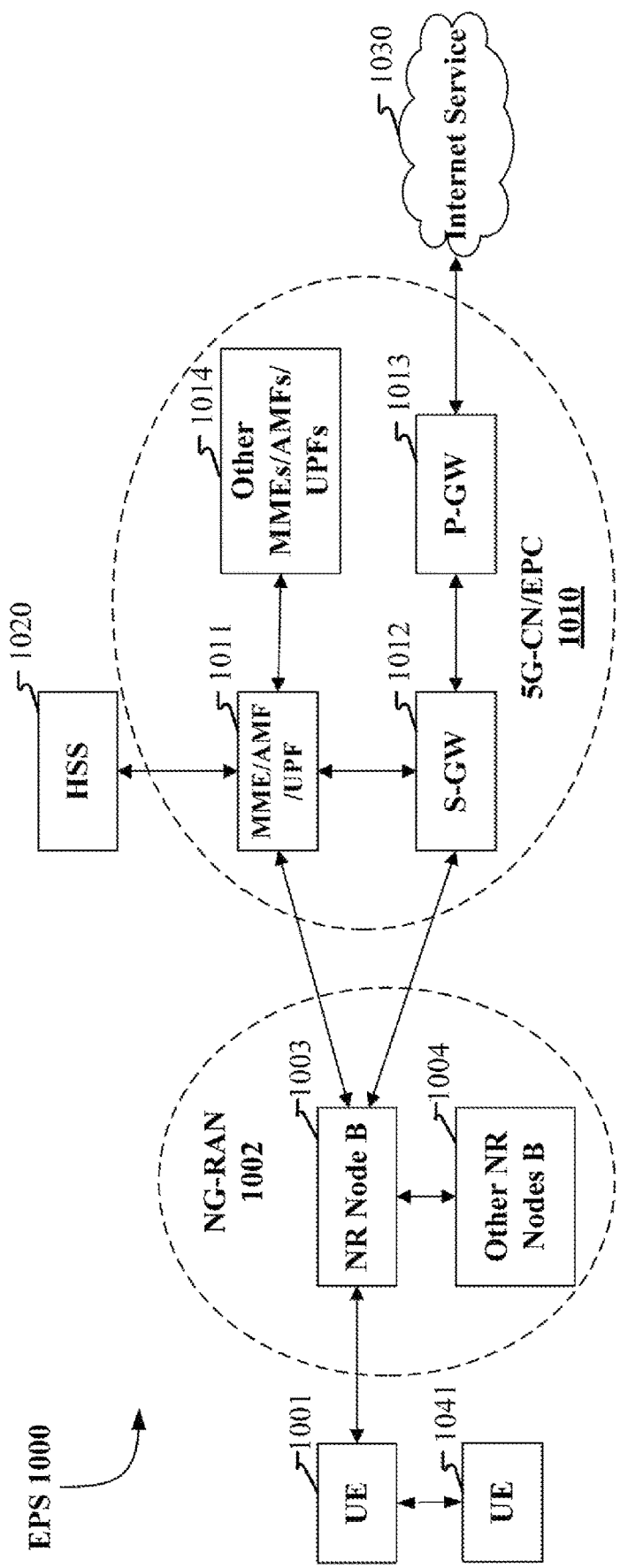
FIG. 10 illustrates a schematic diagram of a network architecture according to one embodiment of the present disclosure.

Embodiment 10 illustrates a schematic diagram of a network architecture according to one embodiment of the present disclosure, as shown in FIG. 10.

FIG. 10 illustrates a network architecture 1000 of Long-Term Evolution (LTE), Long-Term Evolution Advanced (LTE-A) and future 5G systems. The LTE, LTE-A and future 5G network architecture 1000 may be called an Evolved Packet System (EPS) 1000. The EPS 1000 may comprise one or more UEs 1001 and a UE 1041 in Side link communication with the UE(s) 1001, an NG-RAN 1002, a 5G-CoreNetwork/Evolved Packet Core (5G-CN/EPC) 1010, a Home Subscriber Server (HSS) 1020 and an Internet Service 1030. The EPS 1000 may be interconnected with other access networks. For simple description, the entities/interfaces are not shown. As shown in FIG. 10, the EPS 1000 provides packet switching services. Those skilled in the art will find it easy to understand that various concepts presented throughout the present disclosure can be extended to networks providing circuit switching services. The NG-RAN 1002 comprises a New Radio (NR) node B (gNB) 1003 and other gNBs 1004. The gNB 1003 provides UE 1001 oriented user plane and control plane protocol terminations. The gNB 1003 may be connected to other gNBs 1004 via an X2 interface (for example, backhaul). The gNB 1003 may be called a base station, a base transceiver station, a radio base station, a radio transceiver, a transceiver function, a Base Service Set (BSS), an Extended Service Set (ESS), a Transmitter Receiver Point (TRP) or some other applicable terms. The gNB 1003 provides an access point of the 5G-CN/EPC 1010 for the UE 1001. Examples of the UE 1001 include cellular phones, smart phones, Session Initiation Protocol (SIP) phones, laptop computers, Personal Digital Assistant (PDA), Satellite Radios, Global Positioning Systems (GPSs), multimedia devices, video devices, digital audio players (for example, MP3 players), cameras, game consoles, unmanned aerial vehicles, air vehicles, narrow-band physical network equipment, machine-type communication equipment, land vehicles, automobiles, wearable equipment, or any other devices having similar functions. Those skilled in the art also can call the UE 1001 a mobile station, a subscriber station, a mobile unit, a subscriber unit, a wireless unit, a remote unit, a mobile device, a wireless device, a radio communication device, a remote device, a mobile subscriber station, an access terminal, a mobile terminal, a wireless terminal, a remote terminal, a handset, a user proxy, a mobile client, a client or some other appropriate terms. The gNB 1003 is connected to the 5G-CN/EPC 1010 via an S1 interface. The 5G-CN/EPC 1010 comprises a Mobility Management Entity/Authentication Management Field/User Plane Function (MME/AMF/UPF) 1011, other MMEs/AMFs/UPFs 1014, a Service Gateway (S-GW) 1012 and a Packet Date Network Gateway (P-GW) 1013. The MME/AMF/UPF 1011 is a control node for processing a signaling between the UE 1001 and the 5G-CN/EPC 1010. Generally, the MME/AMF/UPF 1011 provides bearer and connection management. All user Internet Protocol (IP) packets are transmitted through the S-GW 1012, the S-GW 1012 is connected to the P-GW 1013. The P-GW 1013 provides UE IP address allocation and other functions. The P-GW 1013 is connected to the Internet Service 1030. The Internet Service 1030 comprises IP services corresponding to operators, specifically including Internet, Intranet, IP Multimedia Subsystem (IMS) and Packet Switching Services (PSS).

In one embodiment, the gNB 1003 corresponds to the base station in the present disclosure.

In one embodiment, the UE 1001 corresponds to the UE in the present disclosure.

In one embodiment, the gNB 1003 supports polar codes.

In one embodiment, the UE 1001 supports polar codes.

EMBODIMENT 11

Figure 11:
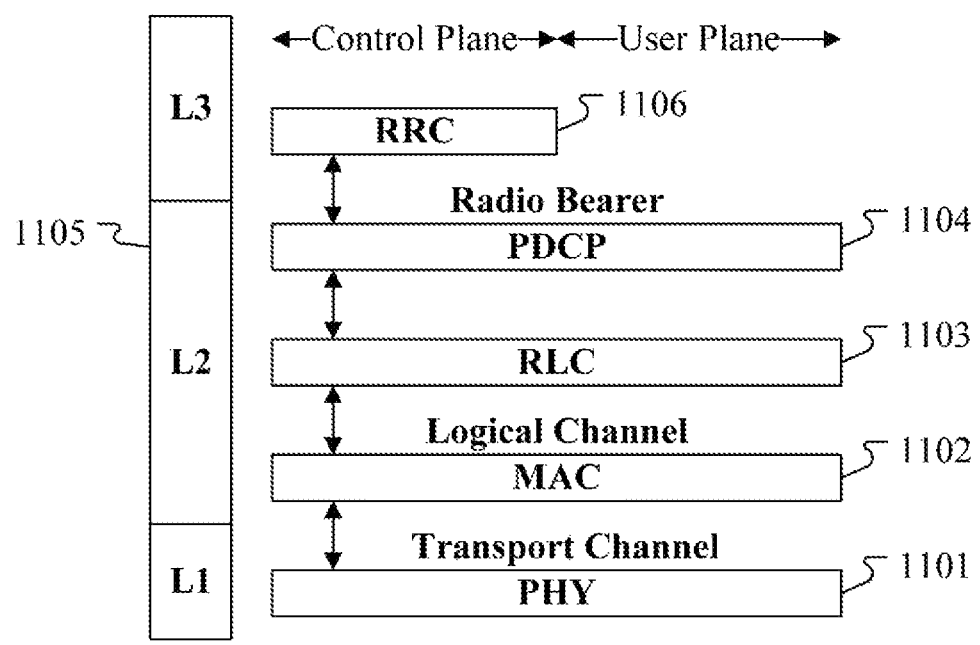
FIG. 11 illustrates a schematic diagram of an embodiment of a radio protocol architecture of a user plane and a control plane according to one embodiment of the present disclosure.

Embodiment 11 illustrates a schematic diagram of an embodiment of a radio protocol architecture of a user plane and a control plane according to one embodiment of the present disclosure; as shown in FIG. 11.

In FIG. 11, the radio protocol architecture for a UE and a gNB is represented by three layers, which are a layer 1, a layer 2, and a layer 3, respectively. The layer 1 (L1) is the lowest layer and performs signal processing functions of various PHY layers. The L1 is called PHY 1101 in the present disclosure. The layer 2 (L2) 1105 is above the PHY 1101, and is in charge of the link between the UE and the gNB via the PHY 1101. In the user plane, L2 1105 comprises a Medium Access Control (MAC) sublayer 1102, a Radio Link Control (RLC) sublayer 1103 and a Packet Data Convergence Protocol (PDCP) sublayer 1104. All the three sublayers terminate at the gNBs of the network side. Although not described in FIG. 11, the UE may comprise several protocol layers above the L2 1105, such as a network layer (i.e., IP layer) terminated at a P-GW 1013 of the network side and an application layer terminated at the other side of the connection (i.e., a peer UE, a server, etc.). The PDCP sublayer 1104 provides multiplexing among variable radio bearers and logical channels. The PDCP sublayer 1104 also provides a header compression for a higher-layer packet so as to reduce a radio transmission overhead. The PDCP sublayer 1104 provides security by encrypting a packet and provides support for UE handover between gNBs. The RLC sublayer 1103 provides segmentation and reassembling of a higher-layer packet, retransmission of a lost packet, and reordering of a packet so as to compensate the disordered receiving caused by Hybrid Automatic Repeat reQuest (HARQ). The MAC sublayer 1102 provides multiplexing between a logical channel and a transport channel. The MAC sublayer 1102 is also responsible for allocating between UEs various radio resources (i.e., resource block) in a cell. The MAC sublayer 1102 is also in charge of HARQ operation. In the control plane, the radio protocol architecture of the UE and the gNB is almost the same as the radio protocol architecture in the user plane on the PHY 1101 and the L2 1105, but there is no header compression for the control plane. The control plane also comprises a Radio Resource Control (RRC) sublayer 1106 in the layer 3 (L3). The RRC sublayer 1106 is responsible for acquiring radio resources (i.e., radio bearer) and configuring the lower layer using an RRC signaling between the gNB and the UE.

In one embodiment, the radio protocol architecture in FIG. 11 is applicable to the base station in the present disclosure.

In one embodiment, the radio protocol architecture in FIG. 11 is applicable to the UE in the present disclosure.

In one embodiment, the first radio signal in the present disclosure is generated by the PHY 1101.

In one embodiment, the first information in the present disclosure is generated by the MAC sublayer 1102.

In one embodiment, the first information in the present disclosure is generated by the RRC sublayer 1106.

EMBODIMENT 12

Figure 12:
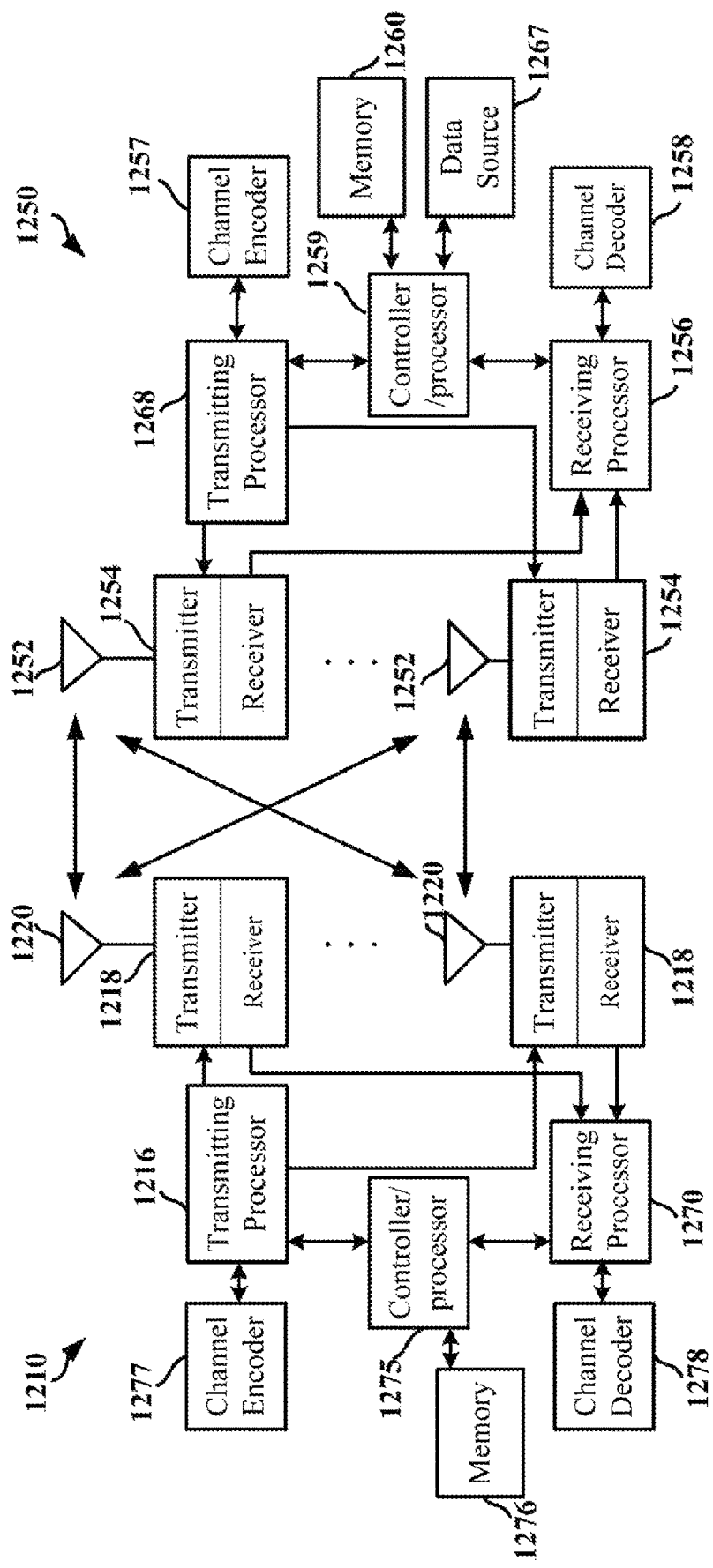
FIG. 12 illustrates a schematic diagram of a New Radio (NR) node and a UE according to one embodiment of the present disclosure.

Embodiment 12 illustrates a schematic diagram of a New Radio (NR) node and a UE according to one embodiment of the present disclosure, as shown in FIG. 12. FIG. 12 is a block diagram of a UE 1250 and a gNB 1210 that are in communication with each other in access network.

The gNB 1210 comprises a controller/processor 1275, a memory 1276, a receiving processor 1270, a transmitting processor 1216, a channel encoder 1277, a channel decoder 1278, a transmitter/receiver 1218 and an antenna 1220.

The UE 1250 comprises a controller/processor 1259, a memory 1260, a data source 1267, a transmitting processor 1268, a receiving processor 1256, a channel encoder 1257, a channel decoder 1258, a transmitter/receiver 1254 and an antenna 1252.

In Downlink (DL) transmission, at the gNB, a higher layer packet from a core network is provided to a controller/processor 1275. The controller/processor 1275 implements a functionality of the L2 layer. In DL transmission, the controller/processor 1275 provides header compression, encrypting, packet segmentation and reordering, multiplexing between a logical channel and a transport channel, and radio resource allocation for the UE 1250 based on various priorities. The controller/processor 1275 is also in charge of HARQ operation, retransmission of a lost packet and a signaling to the UE 1250. The transmitting processor 1216 and the channel encoder 1277 perform signal processing functions used for the L1 layer (that is, PHY). The channel encoder 1277 performs coding and interleaving so as to ensure a Forward Error Correction (FEC) at the UE 1250 side. The transmitting processor 1216 implements the mapping to signal clusters corresponding to each modulation scheme (i.e., BPSK, QPSK, M-PSK, M-QAM, etc.), and performs spatial precoding/beamforming on encoded and modulated symbols to generate one or more spatial streams. The transmitting processor 1216 then maps each spatial stream into a subcarrier. The mapped symbols are multiplexed with a reference signal (i.e., pilot frequency) in time domain and/or frequency domain, and then they are assembled through Inverse Fast Fourier Transform (IFFT) to generate a physical channel carrying time-domain multicarrier symbol streams. Each transmitter 1218 converts a baseband multicarrier symbol stream provided by the transmitting processor 1216 into a radio frequency (RF) stream, which is later provided to different antennas 1220.

In DL transmission, at the UE 1250, each receiver 1254 receives a signal via a corresponding antenna 1252. Each receiver 1254 recovers information modulated to the RF carrier, converts the radio frequency stream into a baseband multicarrier symbol stream to be provided to the receiving processor 1256. The receiving processor 1256 and the channel decoder 1258 perform signal processing functions of the L1 layer. The receiving processor 1256 converts the baseband multicarrier symbol stream from time domain into frequency domain using FFT. In frequency domain, a physical layer data signal and a reference signal are de-multiplexed by the receiving processor 1256, wherein a reference signal is used for channel estimation, while physical layer data is subjected to multi-antenna detection in the receiving processor 1256 to recover UE 1250-targeted spatial streams. Symbols on each spatial stream are demodulated and recovered in the receiving processor 1256 to generate a soft decision. Then the channel decoder 1258 decodes and de-interleaves the soft decision to recover the higher-layer data and control signal transmitted by the gNB 1210 on the physical channel. Next, the higher-layer data and control signal are provided to the controller/processor 1259. The controller/processor 1259 performs functions of the L2 layer. The controller/processor 1259 can be connected to a memory 1260 that stores program code and data. The memory 1260 can be called a computer readable medium. In DL transmission, the controller/processor 1259 provides demultiplexing between a transport channel and a logical channel, packet reassembling, decrypting, header decompression and control signal processing so as to recover a higher-layer packet from the core network. The higher-layer packet is later provided to all protocol layers above the L2 layer, or various control signals can be provided to the L3 layer for processing. The controller/processor 1259 also performs error detection using ACK and/or NACK protocols as a way to support HARQ operation.

In Uplink (UL) transmission, at the UE 1250, the data source 1267 is configured to provide a higher-layer packet to the controller/processor 1259. The data source 1267 represents all protocol layers above the L2 layer. Similar to a transmitting function of the gNB 1210 described in DL transmission, the controller/processor 1259 performs header compression, encrypting, packet segmentation and reordering, and multiplexing between a logical channel and a transport channel based on radio resource allocation of the gNB 1210 so as to provide the L2 layer functions used for the user plane and the control plane. The controller/processor 1259 is also responsible for HARQ operation, retransmission of a lost packet, and a signaling to the gNB 1210. The channel encoder 1257 performs channel coding, and then encoded data is subjected to modulation and multi-antenna spatial precoding/beamforming by the transmitting processor 1268 to be modulated into multicarrier/single-carrier symbol streams. The modulated symbol streams are provided from the transmitters 1254 to each antenna 1252. Each transmitter 1254 first converts a baseband symbol stream provided by the transmitting processor 1268 into a radio frequency symbol stream, and then provides the radio frequency symbol stream to the antenna 1252.

In UL transmission, the function of the gNB 1210 is similar to the receiving function of the UE 1250 described in DL transmission. Each receiver 1218 receives a radio frequency signal via a corresponding antenna 1220, converts the received radio frequency signal into a baseband signal, and provides the baseband signal to the receiving processor 1270. The receiving processor 1270 and the channel decoder 1278 jointly provide functions of the L1 layer. The controller/processor 1275 provides functions of the L2 layer. The controller/processor 1275 can be connected with the memory 1276 that stores program code and data. The memory 1276 can be called a computer readable medium. In UL transmission, the controller/processor 1275 provides de-multiplexing between a transport channel and a logical channel, packet reassembling, decrypting, header decompression, control signal processing so as to recover a higher-layer packet from the UE 1250. The higher-layer packet coming from the controller/processor 1275 may be provided to the core network. The controller/processor 1275 can also perform error detection using ACK and/or NACK protocols to support HARQ operation.

In one embodiment, the UE 1250 comprises at least one processor and at least one memory. The at least one memory includes computer program codes. The at least one memory and the computer program codes are configured to be used in collaboration with the at least one processor. The UE 1250 at least receives the first radio signal in the present disclosure; and performs the channel decoding in the present disclosure. Herein, a channel coding corresponding to the channel decoding is based on a polar code, a first bit block is used for an input to the channel coding; an output after the channel coding is used for generating the first radio signal; the channel decoding is used for recovering the first bit block; the first bit block comprises bit(s) in a first bit sub-block and bit(s) in a second bit sub-block; a value of the first bit sub-block is related to a number of bits in the second bit sub-block; a position(s) of the bit(s) in the first bit sub-block in the first bit block is(are) determined by default; the first bit sub-block and the second bit sub-block respectively comprise a positive integer number of bit(s); the number of bits in the second bit sub-block is a candidate value of the K candidate values; the candidate value is a positive integer, the K is a positive integer greater than 1.

In one embodiment, the UE 1250 comprises a memory that stores a computer readable instruction program. The computer readable instruction program generates an action when executed by at least one processor. The action includes: receiving the first radio signal in the present disclosure; and performing the channel decoding in the present disclosure. Herein, a channel coding corresponding to the channel decoding is based on a polar code, a first bit block is used for an input to the channel coding; an output after the channel coding is used for generating the first radio signal; the channel decoding is used for recovering the first bit block; the first bit block comprises bit(s) in a first bit sub-block and bit(s) in a second bit sub-block; a value of the first bit sub-block is related to a number of bits in the second bit sub-block; a position(s) of the bit(s) in the first bit sub-block in the first bit block is(are) determined by default; the first bit sub-block and the second bit sub-block respectively comprise a positive integer number of bit(s); the number of bits in the second bit sub-block is a candidate value of the K candidate values; the candidate value is a positive integer, the K is a positive integer greater than 1.

In one embodiment, the gNB 1210 comprises at least one processor and at least one memory. The at least one memory includes computer program codes. The at least one memory and the computer program codes are configured to be used in collaboration with the at least one processor. The gNB 1210 at least performs the channel coding in the present disclosure; and transmits the first radio signal in the present disclosure. Herein, a first bit block is used for an input to the channel coding; the channel coding is based on a polar code; an output after the channel coding is used for generating the first radio signal; the first bit block comprises bit(s) in a first bit sub-block and bit(s) in a second bit sub-block; a value of the first bit sub-block is related to a number of bits in the second bit sub-block; a position(s) of the bit(s) in the first bit sub-block in the first bit block is(are) determined by default; the first bit sub-block and the second bit sub-block respectively comprise a positive integer number of bit(s); the number of bits in the second bit sub-block is a candidate value of the K candidate values; the candidate value is a positive integer, the K is a positive integer greater than 1.

In one embodiment, the gNB 1210 comprises a memory that stores a computer readable instruction program. The computer readable instruction program generates an action when executed by at least one processor. The action includes: performing the channel coding in the present disclosure; and transmitting the first radio signal in the present disclosure. Herein, a first bit block is used for an input to the channel coding; the channel coding is based on a polar code; an output after the channel coding is used for generating the first radio signal; the first bit block comprises bit(s) in a first bit sub-block and bit(s) in a second bit sub-block; a value of the first bit sub-block is related to a number of bits in the second bit sub-block; a position(s) of the bit(s) in the first bit sub-block in the first bit block is(are) determined by default; the first bit sub-block and the second bit sub-block respectively comprise a positive integer number of bit(s); the number of bits in the second bit sub-block is a candidate value of the K candidate values; the candidate value is a positive integer, the K is a positive integer greater than 1.

In one embodiment, the UE 1250 comprises at least one processor and at least one memory. The at least one memory includes computer program codes. The at least one memory and the computer program codes are configured to be used in collaboration with the at least one processor. The UE 1250 at least receives the first radio signal in the present disclosure; and performs the channel decoding in the present disclosure. Herein, a channel coding corresponding to the channel decoding is based on a polar code, a first bit block is used for an input to the channel coding; an output after the channel coding is used for generating the first radio signal; the channel decoding is used for recovering the first bit block; the first bit block comprises bit(s) in a first bit sub-block and bit(s) in a second bit sub-block; a value of the first bit sub-block is related to a number of bits in the first bit block; a position(s) of the bit(s) in the first bit sub-block in the first bit block is(are) determined by default; the first bit sub-block and the second bit sub-block respectively comprise a positive integer number of bit(s); the number of bits in the second bit sub-block is a candidate value of the K candidate values; the candidate value is a positive integer, the K is a positive integer greater than 1.

In one embodiment, the UE 1250 comprises a memory that stores a computer readable instruction program. The computer readable instruction program generates an action when executed by at least one processor. The action includes: receiving the first radio signal in the present disclosure; and performing the channel decoding in the present disclosure. Herein, a channel coding corresponding to the channel decoding is based on a polar code, a first bit block is used for an input to the channel coding; an output after the channel coding is used for generating the first radio signal; the channel decoding is used for recovering the first bit block; the first bit block comprises bit(s) in a first bit sub-block and bit(s) in a second bit sub-block; a value of the first bit sub-block is related to a number of bits in the first bit block; a position(s) of the bit(s) in the first bit sub-block in the first bit block is(are) determined by default; the first bit sub-block and the second bit sub-block respectively comprise a positive integer number of bit(s); the number of bits in the second bit sub-block is a candidate value of the K candidate values; the candidate value is a positive integer, the K is a positive integer greater than 1.

In one embodiment, the gNB 1210 comprises at least one processor and at least one memory. The at least one memory includes computer program codes. The at least one memory and the computer program codes are configured to be used in collaboration with the at least one processor. The gNB 1210 at least performs the channel coding in the present disclosure; and transmits the first radio signal in the present disclosure. Herein, a first bit block is used for an input to the channel coding; the channel coding is based on a polar code; an output after the channel coding is used for generating the first radio signal; the first bit block comprises bit(s) in a first bit sub-block and bit(s) in a second bit sub-block; a value of the first bit sub-block is related to a number of bits in the first bit block; a position(s) of the bit(s) in the first bit sub-block in the first bit block is(are) determined by default; the first bit sub-block and the second bit sub-block respectively comprise a positive integer number of bit(s); the number of bits in the second bit sub-block is a candidate value of the K candidate values; the candidate value is a positive integer, the K is a positive integer greater than 1.

In one embodiment, the gNB 1210 comprises a memory that stores a computer readable instruction program. The computer readable instruction program generates an action when executed by at least one processor. The action includes: performing the channel coding in the present disclosure; and transmitting the first radio signal in the present disclosure. Herein, a first bit block is used for an input to the channel coding; the channel coding is based on a polar code; an output after the channel coding is used for generating the first radio signal; the first bit block comprises bit(s) in a first bit sub-block and bit(s) in a second bit sub-block; a value of the first bit sub-block is related to a number of bits in the first bit block; a position(s) of the bit(s) in the first bit sub-block in the first bit block is(are) determined by default; the first bit sub-block and the second bit sub-block respectively comprise a positive integer number of bit(s); the number of bits in the second bit sub-block is a candidate value of the K candidate values; the candidate value is a positive integer, the K is a positive integer greater than 1.

In one embodiment, the UE 1250 corresponds to the UE in the present disclosure, the gNB 1210 corresponds to the base station in the present disclosure.

In one embodiment, at least one of the transmitting processor 1216 and the channel encoder 1277 is used for performing the channel coding in the present disclosure; at least one of the receiving processor 1256 or the channel decoder 1258 is used for performing the channel decoding in the present disclosure.

In one embodiment, at least one of the antenna 1220, the transmitter 1218, the transmitting processor 1216, the channel encoder 1277, the controller/processor 1275 and the memory 1276 is used for transmitting the first radio signal in the present disclosure; at least one of the antenna 1252, the receiver 1254, the receiving processor 1256, the channel decoder 1258, the controller/processor 1259, the memory 1260 or the data source 1267 is used for receiving the first radio signal in the present disclosure.

In one embodiment, at least one of the antenna 1220, the transmitter 1218, the transmitting processor 1216, the channel encoder 1277, the controller/processor 1275 or the memory 1276 is used for transmitting the first information in the present disclosure; at least one of the antenna 1252, the receiver 1254, the receiving processor 1256, the channel decoder 1258, the controller/processor 1259, the memory 1260 or the data source 1267 is used for receiving the first information in the present disclosure.

In one embodiment, at least one of the transmitting processor 1216 or the channel encoder 1277 is used for determining a number of bit(s) in the third bit sub-block in the present disclosure.

In one embodiment, at least one of the receiving processor 1256 or the channel decoder 1258 is used for performing channel pre-decoding based on the first hypothesis in the present disclosure.

In one embodiment, at least one of the receiving processor 1256 or the channel decoder 1258 is used for determining a number of bit(s) in the third bit sub-block in the present disclosure.

The ordinary skill in the art may understand that all or part of steps in the above method may be implemented by instructing related hardware through a program. The program may be stored in a computer readable storage medium, for example Read-Only-Memory (ROM), hard disk or compact disc, etc. Optionally, all or part of steps in the above embodiments also may be implemented by one or more integrated circuits. Correspondingly, each module unit in the above embodiment may be implemented in the form of hardware, or in the form of software function modules. The present disclosure is not limited to any combination of hardware and software in specific forms. The UE or terminal in the present disclosure includes but is not limited to mobile phones, tablet computers, notebooks, network cards, NB-IOT terminals, enhanced MTC (eMTC) terminals, etc. The base station or system device in the present disclosure includes but is not limited to macro-cellular base stations, micro-cellular base stations, home base stations, relay base station and other radio communication equipment.

The above are merely the preferred embodiments of the present disclosure and are not intended to limit the scope of protection of the present disclosure. Any modification, equivalent substitute and improvement made within the spirit and principle of the present disclosure are intended to be included within the scope of protection of the present disclosure.

What is claimed is:

1. A method in a base station for wireless communication, comprising:
   performing channel coding; and
   transmitting a first radio signal, a first bit block is used for generating the first radio signal;
   wherein the first bit block is used for an input to the channel coding; the channel coding is based on a polar code; an output after the channel coding is used for generating the first radio signal; the first bit block comprises bit(s) in a first bit sub block and bits in a second bit sub-block; a value of the first bit sub-block indicates a quantity of bits in the second bit sub-block and positions of the bits in the second bit sub-block; the first bit block only comprises all information bits in an input to the channel coding; a position of one bit of the first bit sub-block in the first bit block is determined by default; the first bit sub-block and the second bit sub-block respectively comprise a positive integer number of bit(s); the quantity of the bits in the second bit sub-block is a candidate value of K candidate values; the candidate value is a positive integer, the K is a positive integer greater than 1; the base station assumes that a probability that a receiver incorrectly decodes the first bit sub-block based on a first hypothesis is no higher than a first threshold, the first hypothesis is that the quantity of the bits in the second bit sub-block is equal to a maximum value of the K candidate values.

2. The method according to claim 1, further comprising:
   transmitting first information;
   wherein the first information is used for determining a quantity of the bit(s) in the first bit sub-block and the K candidate values, or the first information is used for determining a quantity of the bit(s) in the first bit sub-block, or the first information is used for determining the K candidate values.

3. The method according to claim 1, wherein the second bit sub-block comprises a first bit set and a second bit set, the bit(s) in the first bit sub block and bit(s) in the first bit set are used for generating the second bit set;
   or, the value of the first bit sub-block is used for determining at least one of an information format of the second bit sub-block and a polynomial corresponding to a redundancy check bit(s) in the first bit block;
   or, an average of channel capacity(capacities) of sub-channel(s) mapped by the bit(s) in the first bit sub-block is greater than an average of channel capacities of sub-channels mapped by the bits in the second bit sub-block.

4. The method according to claim 1, wherein the first radio signal is transmitted on a physical layer control channel, or the first bit sub-block and the second bit sub-block belong to same Downlink Control Information (DCI).

5. A method in a User Equipment (UE) for wireless communication, comprising:
   receiving a first radio signal; and
   performing channel pre-decoding based on a first hypothesis; and
   performing channel decoding, a first bit block is used for generating the first radio signal;
   wherein a channel coding corresponding to the channel decoding is based on a polar code, the first bit block is used for an input to the channel coding; an output after the channel coding is used for generating the first radio signal; the channel decoding is used for recovering the first bit block; the first bit block comprises bit(s) in a first bit sub-block and bits in a second bit sub-block; a value of the first bit sub-block indicates a quantity of bits in the second bit sub-block and positions of the bits in the second bit sub-block; the first bit block only comprises all information bits in an input to the channel coding; a position of one bit of the first bit sub-block in the first bit block is determined by default; the first bit sub-block and the second bit sub-block respectively comprise a positive integer number of bit(s); the quantity of the bits in the second bit sub-block is a candidate value of K candidate values; the candidate value is a positive integer, the K is a positive integer greater than 1; an output after the channel pre-decoding comprises the first bit sub-block, the first hypothesis is that the quantity of the bits in the second bit sub-block is equal to a maximum value of the K candidate values.

6. The method according to claim 5, further comprising:
   receiving first information;
   wherein the first information is used for determining a quantity of the bit(s) in the first bit sub-block and the K candidate values, or the first information is used for determining a quantity of the bit(s) in the first bit sub-block, or the first information is used for determining the K candidate values.

7. The method according to claim 5, wherein the second bit sub-block comprises a first bit set and a second bit set, the bit(s) in the first bit sub-block and bit(s) in the first bit set are used for generating the second bit set;

or, the value of the first bit sub-block is used for determining at least one of an information format of the second bit sub-block and a polynomial corresponding to a redundancy check bit(s) in the first bit block;

or, an average of channel capacity(capacities) of sub-channel(s) mapped by the bit(s) in the first bit sub-block is greater than an average of channel capacities of sub-channels mapped by the bits in the second bit sub-block.

8. The method according to claim 5, wherein the first radio signal is transmitted on a physical layer control channel, or the first bit sub-block and the second bit sub-block belong to same DCI.

9. A base station used for wireless communication, comprising:

a first executor, performing channel coding; and a first transmitter, transmitting a first radio signal, a first bit block is used for generating the first radio signal;

wherein the first bit block is used for an input to the channel coding; the channel coding is based on a polar code; an output after the channel coding is used for generating the first radio signal;

the first bit block comprises bit(s) in a first bit sub-block and bits in a second bit sub-block; a value of the first bit sub-block indicates a quantity of bits in the second bit sub-block and positions of the bits in the second bit sub-block; the first bit block only comprises all information bits in an input to the channel coding; a position of one bit of the first bit sub-block in the first bit block is determined by default; the first bit sub-block and the second bit sub-block respectively comprise a positive integer number of bit(s); the quantity of the bits in the second bit sub-block is a candidate value of K candidate values; the candidate value is a positive integer, the K is a positive integer greater than 1; the base station assumes that a probability that a receiver incorrectly decodes the first bit sub-block based on a first hypothesis is no higher than a first threshold, the first hypothesis is that the quantity of the bits in the second bit sub-block is equal to a maximum value of the K candidate values.

10. The base station according to claim 9, wherein the first executor also transmits first information; wherein the first information is used for determining a quantity of the bit(s) in the first bit sub-block and the K candidate values, or the first information is used for determining a quantity of the bit(s) in the first bit sub-block, or the first information is used for determining the K candidate values.

11. The base station according to claim 9, wherein the second bit sub-block comprises a first bit set and a second bit set, the bit(s) in the first bit sub-block and bit(s) in the first bit set are used for generating the second bit set;

or, the value of the first bit sub-block is used for determining at least one of an information format of the second bit sub-block and a polynomial corresponding to a redundancy check bit(s) in the first bit block;

or, an average of channel capacity(capacities) of sub-channel(s) mapped by the bit(s) in the first bit sub-block is greater than an average of channel capacities of sub-channels mapped by the bits in the second bit sub-block.

12. The base station according to claim 9, wherein the first radio signal is transmitted on a physical layer control channel, or the first bit sub-block and the second bit sub-block belong to same DCI.

13. A UE used for wireless communication, comprising:

a first receiver, receiving a first radio signal and performing channel pre-decoding based on a first hypothesis; and a second executor, performing channel decoding, a first bit block is used for generating the first radio signal;

wherein a channel coding corresponding to the channel decoding is based on a polar code, the first bit block is used for an input to the channel coding; an output after the channel coding is used for generating the first radio signal; the channel decoding is used for recovering the first bit block; the first bit block comprises bit(s) in a first bit sub-block and bits in a second bit sub-block; a value of the first bit sub-block indicates a quantity of bits in the second bit sub-block and positions of the bits in the second bit sub-block; the first bit block only comprises all information bits in an input to the channel coding; a position of one bit of the first bit sub-block in the first bit block is determined by default; the first bit sub-block and the second bit sub-block respectively comprise a positive integer number of bit(s); the quantity of the bits in the second bit sub-block is a candidate value of K candidate values; the candidate value is a positive integer, the K is a positive integer greater than 1; an output after the channel pre-decoding comprises the first bit sub-block, the first hypothesis is that the quantity of the bits in the second bit sub-block is equal to a maximum value of the K candidate values.

14. The UE according to claim 13, wherein the first receiver also receives first information; wherein the first information is used for determining a quantity of the bit(s) in the first bit sub-block and the K candidate values, or the first information is used for determining a quantity of the bit(s) in the first bit sub-block, or the first information is used for determining the K candidate values.

15. The UE according to claim 13, wherein the second bit sub-block comprises a first bit set and a second bit set, the bit(s) in the first bit sub-block and bit(s) in the first bit set are used for generating the second bit set;

or, the value of the first bit sub-block is used for determining at least one of an information format of the second bit sub-block and a polynomial corresponding to a redundancy check bit(s) in the first bit block;

or, an average of channel capacity(capacities) of sub-channel(s) mapped by the bit(s) in the first bit sub-block is greater than an average of channel capacities of sub-channels mapped by the bits in the second bit sub-block.

16. The UE according to claim 13, wherein the first radio signal is transmitted on a physical layer control channel, or the first bit sub-block and the second bit sub-block belong to same DCI.

* * * * *